(12) United States Patent
Goergen

(10) Patent No.: US 11,906,799 B2
(45) Date of Patent: Feb. 20, 2024

(54) INTEGRATION OF POWER AND OPTICS THROUGH COLD PLATES FOR DELIVERY TO ELECTRONIC AND PHOTONIC INTEGRATED CIRCUITS

(71) Applicant: Cisco Technology, Inc., San Jose, CA (US)

(72) Inventor: Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/688,271

(22) Filed: Mar. 7, 2022

(65) Prior Publication Data

US 2022/0187553 A1   Jun. 16, 2022

Related U.S. Application Data

(63) Continuation of application No. 16/983,932, filed on Aug. 3, 2020, now Pat. No. 11,307,368, which is a continuation-in-part of application No. 16/842,393, filed on Apr. 7, 2020, now Pat. No. 11,320,610.

(60) Provisional application No. 63/012,822, filed on Apr. 20, 2020.

(51) Int. Cl.
*G02B 6/42* (2006.01)
*H01L 23/367* (2006.01)
*H01L 23/498* (2006.01)

(52) U.S. Cl.
CPC ......... *G02B 6/4268* (2013.01); *G02B 6/4214* (2013.01); *H01L 23/3675* (2013.01); *H01L 23/49827* (2013.01)

(58) Field of Classification Search
CPC .. G02B 6/4268; G02B 6/4214; G02B 6/4246; G02B 6/428; G02B 6/43; G02B 6/4293; H01L 23/3675; H01L 23/49827
See application file for complete search history.

(56) References Cited

U.S. PATENT DOCUMENTS

| | | | |
|---|---|---|---|
| 3,335,324 A | 8/1967 | Buckeridge |
| 3,962,529 A | 6/1976 | Kubo |
| 4,811,187 A | 3/1989 | Nakajima |
| 4,997,388 A | 3/1991 | Dale |
| 5,053,920 A | 10/1991 | Staffiere et al. |

(Continued)

FOREIGN PATENT DOCUMENTS

| | | |
|---|---|---|
| CN | 1209880 C | 7/2005 |
| CN | 201689347 U | 12/2010 |

(Continued)

OTHER PUBLICATIONS https://www.fischerconnectors.com/us/en/products/fiberoptic.

(Continued)

*Primary Examiner* — John Bedtelyon

(57) ABSTRACT

In one embodiment, an apparatus includes an upper cold plate and a lower cold plate, at least one of the upper cold plate or the lower cold plate comprising an electrical or optical path extending therethrough, a substrate and die package interposed between the upper cold plate or the lower cold plate, and a connector coupled to one of the upper cold plate or the lower cold plate for transmitting power or an optical signal through the electrical or optical path to the substrate and die package.

20 Claims, 15 Drawing Sheets

(56) References Cited

U.S. PATENT DOCUMENTS

| | | |
|---|---|---|
| 5,652,893 A | 7/1997 | Ben-Meir |
| 5,901,040 A | 5/1999 | Cromwell et al. |
| 6,008,631 A | 12/1999 | Johari |
| 6,220,955 B1 | 4/2001 | Posa |
| 6,259,745 B1 | 7/2001 | Chan |
| 6,285,550 B1 | 9/2001 | Belady |
| 6,353,264 B1 | 3/2002 | Coronel et al. |
| 6,636,538 B1 | 10/2003 | Stephens |
| 6,685,364 B1 | 2/2004 | Brezina |
| 6,690,696 B2 | 2/2004 | Byren et al. |
| 6,784,790 B1 | 8/2004 | Lester |
| 6,826,368 B1 | 11/2004 | Koren |
| 6,855,881 B2 | 2/2005 | Khoshnood |
| 6,860,004 B2 | 3/2005 | Hirano |
| 7,266,267 B2 | 9/2007 | Bakir et al. |
| 7,310,430 B1 | 12/2007 | Mallya et al. |
| 7,325,150 B1 | 1/2008 | Lehr |
| 7,420,355 B2 | 9/2008 | Liu |
| 7,490,996 B2 | 2/2009 | Sommer |
| 7,492,059 B2 | 2/2009 | Peker |
| 7,509,505 B2 | 3/2009 | Randall |
| 7,583,703 B2 | 9/2009 | Bowser |
| 7,589,435 B2 | 9/2009 | Metsker |
| 7,593,747 B1 | 9/2009 | Karam |
| 7,603,570 B2 | 10/2009 | Schindler |
| 7,616,465 B1 | 11/2009 | Vinciarelli |
| 7,813,646 B2 | 10/2010 | Furey |
| 7,835,389 B2 | 11/2010 | Yu |
| 7,854,634 B2 | 12/2010 | Filipon |
| 7,881,072 B2 | 2/2011 | DiBene |
| 7,915,761 B1 | 3/2011 | Jones |
| 7,921,307 B2 | 4/2011 | Karam |
| 7,924,579 B2 | 4/2011 | Arduini |
| 7,940,787 B2 | 5/2011 | Karam |
| 7,973,538 B2 | 7/2011 | Karam |
| 8,020,043 B2 | 9/2011 | Karam |
| 8,037,324 B2 | 10/2011 | Hussain |
| 8,081,589 B1 | 12/2011 | Gilbrech |
| 8,184,525 B2 | 5/2012 | Karam |
| 8,276,397 B1 | 10/2012 | Carlson |
| 8,279,883 B2 | 10/2012 | Diab |
| 8,310,089 B2 | 11/2012 | Schindler |
| 8,319,627 B2 | 11/2012 | Chan |
| 8,345,439 B1 | 1/2013 | Goergen |
| 8,350,538 B2 | 1/2013 | Cuk |
| 8,358,893 B1 | 1/2013 | Sanderson |
| 8,386,820 B2 | 2/2013 | Diab |
| 8,700,923 B2 | 4/2014 | Fung |
| 8,712,324 B2 | 4/2014 | Corbridge |
| 8,750,710 B1 | 6/2014 | Hirt |
| 8,781,637 B2 | 7/2014 | Eaves |
| 8,787,775 B2 | 7/2014 | Earnshaw |
| 8,829,917 B1 | 9/2014 | Lo |
| 8,836,228 B2 | 9/2014 | Xu |
| 8,842,430 B2 | 9/2014 | Hellriegel |
| 8,849,471 B2 | 9/2014 | Daniel |
| 8,966,747 B2 | 3/2015 | Vinciarelli |
| 9,019,895 B2 | 4/2015 | Li |
| 9,024,473 B2 | 5/2015 | Huff |
| 9,184,795 B2 | 11/2015 | Eaves |
| 9,189,036 B2 | 11/2015 | Ghoshal |
| 9,189,043 B2 | 11/2015 | Vorenkamp et al. |
| 9,273,906 B2 | 3/2016 | Goth |
| 9,319,101 B2 | 4/2016 | Lontka |
| 9,321,362 B2 | 4/2016 | Woo |
| 9,373,963 B2 | 6/2016 | Kuznelsov |
| 9,419,436 B2 | 8/2016 | Eaves |
| 9,484,771 B2 | 11/2016 | Braylovskiy |
| 9,510,479 B2 | 11/2016 | Vos |
| 9,531,551 B2 | 12/2016 | Balasubramanian |
| 9,590,811 B2 | 3/2017 | Hunter, Jr. |
| 9,618,714 B2 | 4/2017 | Murray |
| 9,640,998 B2 | 5/2017 | Dawson |
| 9,646,916 B1 | 5/2017 | Emma |
| 9,665,148 B2 | 5/2017 | Hamdi |
| 9,693,244 B2 | 6/2017 | Maruhashi |
| 9,734,940 B1 | 8/2017 | McNutt |
| 9,853,689 B2 | 12/2017 | Eaves |
| 9,874,930 B2 | 1/2018 | Vavilala |
| 9,882,656 B2 | 1/2018 | Sipes, Jr. |
| 9,893,521 B2 | 2/2018 | Lowe |
| 9,948,198 B2 | 4/2018 | Imai |
| 9,979,370 B2 | 5/2018 | Xu |
| 9,985,600 B2 | 5/2018 | Xu et al. |
| 10,007,628 B2 | 6/2018 | Pitigoi-Aron |
| 10,028,417 B2 | 7/2018 | Schmidtke |
| 10,128,764 B1 | 11/2018 | Vinciarelli |
| 10,157,817 B1 * | 12/2018 | Zhou ................... H01L 21/4857 |
| 10,211,590 B2 | 2/2019 | Filgas et al. |
| 10,248,178 B2 | 4/2019 | Brooks |
| 10,281,513 B1 | 5/2019 | Goergen |
| 10,393,959 B1 | 8/2019 | Razdan et al. |
| 10,407,995 B2 | 9/2019 | Moeny |
| 10,439,432 B2 | 10/2019 | Eckhardt |
| 10,541,758 B2 | 1/2020 | Goergen |
| 10,631,443 B2 | 4/2020 | Byers |
| 10,877,219 B1 | 12/2020 | Traverso et al. |
| 2001/0024373 A1 | 9/2001 | Cuk |
| 2002/0126967 A1 | 9/2002 | Panak |
| 2003/0147225 A1 | 8/2003 | Kenny, Jr. et al. |
| 2004/0000816 A1 | 1/2004 | Khoshnood |
| 2004/0033076 A1 | 2/2004 | Song et al. |
| 2004/0043651 A1 | 3/2004 | Bain |
| 2004/0073703 A1 | 4/2004 | Boucher |
| 2004/0264214 A1 | 12/2004 | Xu |
| 2005/0197018 A1 | 9/2005 | Lord |
| 2005/0268120 A1 | 12/2005 | Schindler |
| 2006/0125092 A1 | 6/2006 | Marshall |
| 2006/0202109 A1 | 9/2006 | Delcher |
| 2006/0209875 A1 | 9/2006 | Lum |
| 2007/0103168 A1 | 5/2007 | Batten |
| 2007/0143508 A1 | 6/2007 | Linnman |
| 2007/0236853 A1 | 10/2007 | Crawley |
| 2007/0263675 A1 | 11/2007 | Lum |
| 2007/0284946 A1 | 12/2007 | Robbins |
| 2007/0288125 A1 | 12/2007 | Quaratiello |
| 2008/0054720 A1 | 3/2008 | Lum |
| 2008/0198635 A1 | 8/2008 | Hussain |
| 2008/0229120 A1 | 9/2008 | Diab |
| 2008/0310067 A1 | 12/2008 | Diab |
| 2009/0027033 A1 | 1/2009 | Diab |
| 2009/0294954 A1 | 12/2009 | Bakir et al. |
| 2010/0077239 A1 | 3/2010 | Diab |
| 2010/0117808 A1 | 5/2010 | Karam |
| 2010/0171602 A1 | 7/2010 | Kabbara |
| 2010/0187683 A1 | 7/2010 | Bakir et al. |
| 2010/0190384 A1 | 7/2010 | Lanni |
| 2010/0237846 A1 | 9/2010 | Vetteth |
| 2010/0290190 A1 | 11/2010 | Chester |
| 2011/0004773 A1 | 1/2011 | Hussain |
| 2011/0007664 A1 | 1/2011 | Diab |
| 2011/0057612 A1 | 3/2011 | Taguchi |
| 2011/0083824 A1 | 4/2011 | Rogers |
| 2011/0085304 A1 | 4/2011 | Bindrup et al. |
| 2011/0228578 A1 | 9/2011 | Serpa |
| 2011/0266867 A1 | 11/2011 | Schindler et al. |
| 2011/0290497 A1 | 12/2011 | Stenevik |
| 2012/0043935 A1 | 2/2012 | Dyer |
| 2012/0064745 A1 | 3/2012 | Ottliczky |
| 2012/0147559 A1 | 6/2012 | Barowski et al. |
| 2012/0170927 A1 | 7/2012 | Huang |
| 2012/0201089 A1 | 8/2012 | Barth |
| 2012/0231654 A1 | 9/2012 | Conrad |
| 2012/0287984 A1 | 11/2012 | Lee |
| 2012/0317426 A1 | 12/2012 | Hunter, Jr. |
| 2012/0319468 A1 | 12/2012 | Schneider |
| 2013/0077923 A1 | 3/2013 | Weem |
| 2013/0079633 A1 | 3/2013 | Weem |
| 2013/0103220 A1 | 4/2013 | Eaves |
| 2013/0249292 A1 | 9/2013 | Blackwell, Jr. |
| 2013/0272721 A1 | 10/2013 | Van Veen |
| 2013/0329344 A1 | 12/2013 | Tucker |
| 2014/0030900 A1 * | 1/2014 | Leigh ................... H01L 25/0652 |
| | | 439/196 |

(56) References Cited

U.S. PATENT DOCUMENTS

| | | |
|---|---|---|
| 2014/0064675 A1 | 3/2014 | Tanaka et al. |
| 2014/0111180 A1 | 4/2014 | Madan |
| 2014/0126151 A1 | 5/2014 | Campbell |
| 2014/0129850 A1 | 5/2014 | Paul |
| 2014/0258742 A1 | 9/2014 | Chien |
| 2014/0258813 A1 | 9/2014 | Lusted |
| 2014/0265550 A1 | 9/2014 | Milligan |
| 2014/0348462 A1 | 11/2014 | Yabre |
| 2014/0372773 A1 | 12/2014 | Heath |
| 2015/0078740 A1 | 3/2015 | Sipes, Jr. |
| 2015/0106539 A1 | 4/2015 | Leinonen |
| 2015/0115741 A1 | 4/2015 | Dawson |
| 2015/0207317 A1 | 7/2015 | Radermacher |
| 2015/0215001 A1 | 7/2015 | Eaves |
| 2015/0215131 A1 | 7/2015 | Paul |
| 2015/0309271 A1 | 10/2015 | Huegerich et al. |
| 2015/0333918 A1 | 11/2015 | White, III |
| 2015/0340818 A1 | 11/2015 | Scherer |
| 2016/0018252 A1 | 1/2016 | Hanson |
| 2016/0020911 A1 | 1/2016 | Sipes, Jr. |
| 2016/0064938 A1 | 3/2016 | Balasubramanian |
| 2016/0111877 A1 | 4/2016 | Eaves |
| 2016/0118784 A1 | 4/2016 | Saxena |
| 2016/0133355 A1 | 5/2016 | Glew |
| 2016/0134331 A1 | 5/2016 | Eaves |
| 2016/0142217 A1 | 5/2016 | Gardner |
| 2016/0188427 A1 | 6/2016 | Chandrashekar |
| 2016/0197600 A1 | 7/2016 | Kuznetsov |
| 2016/0241148 A1 | 8/2016 | Kizilyalli |
| 2016/0259140 A1 | 9/2016 | Blomster |
| 2016/0262288 A1 | 9/2016 | Chainer |
| 2016/0273722 A1 | 9/2016 | Crenshaw |
| 2016/0294500 A1 | 10/2016 | Chawgo |
| 2016/0308683 A1 | 10/2016 | Pischl |
| 2016/0352535 A1 | 12/2016 | Hiscock |
| 2016/0365967 A1 | 12/2016 | Tu et al. |
| 2017/0041152 A1 | 2/2017 | Sheffield |
| 2017/0041153 A1 | 2/2017 | Picard |
| 2017/0047312 A1 | 2/2017 | Budd et al. |
| 2017/0054296 A1 | 2/2017 | Daniel |
| 2017/0110871 A1 | 4/2017 | Foster |
| 2017/0123466 A1 | 5/2017 | Carnevale |
| 2017/0146260 A1 | 5/2017 | Ribbich |
| 2017/0155517 A1 | 6/2017 | Cao |
| 2017/0155518 A1 | 6/2017 | Yang |
| 2017/0164525 A1 | 6/2017 | Chapel |
| 2017/0214236 A1 | 7/2017 | Eaves |
| 2017/0229886 A1 | 8/2017 | Eaves |
| 2017/0234738 A1 | 8/2017 | Ross |
| 2017/0244318 A1 | 8/2017 | Giuliano |
| 2017/0248976 A1 | 8/2017 | Moller |
| 2017/0294966 A1 | 10/2017 | Jia |
| 2017/0325320 A1 | 11/2017 | Wendt |
| 2018/0024964 A1 | 1/2018 | Mao |
| 2018/0053313 A1 | 2/2018 | Smith |
| 2018/0054083 A1 | 2/2018 | Hick |
| 2018/0060269 A1 | 3/2018 | Kessler |
| 2018/0088648 A1 | 3/2018 | Otani |
| 2018/0098201 A1 | 4/2018 | Torello |
| 2018/0102604 A1 | 4/2018 | Keith |
| 2018/0123360 A1 | 5/2018 | Eaves |
| 2018/0159430 A1 | 6/2018 | Albert |
| 2018/0188712 A1 | 7/2018 | MacKay |
| 2018/0191513 A1 | 7/2018 | Hess |
| 2018/0254624 A1 | 9/2018 | Son |
| 2018/0313886 A1 | 11/2018 | Mlyniec |
| 2018/0340840 A1 | 11/2018 | Bullock |
| 2019/0029102 A1 | 1/2019 | Chen et al. |
| 2019/0126764 A1 | 5/2019 | Fuhrer |
| 2019/0267804 A1 | 8/2019 | Matan |
| 2019/0272011 A1 | 9/2019 | Goergen |
| 2019/0277899 A1 | 9/2019 | Goergen |
| 2019/0277900 A1 | 9/2019 | Goergen |
| 2019/0278347 A1 | 9/2019 | Goergen |
| 2019/0280895 A1 | 9/2019 | Mather |
| 2019/0304630 A1 | 10/2019 | Goergen |
| 2019/0312751 A1 | 10/2019 | Goergen |
| 2019/0342011 A1 | 11/2019 | Goergen et al. |
| 2019/0363493 A1 | 11/2019 | Sironi |
| 2019/0391350 A1 | 12/2019 | Evans et al. |
| 2020/0029475 A1* | 1/2020 | Park ................... H05K 1/18 |
| 2020/0044751 A1 | 2/2020 | Goergen |
| 2020/0057218 A1 | 2/2020 | Islam et al. |
| 2020/0350096 A1 | 11/2020 | Zanetti et al. |
| 2021/0055489 A1 | 2/2021 | Maker et al. |
| 2021/0219415 A1 | 7/2021 | Goergen et al. |

FOREIGN PATENT DOCUMENTS

| | | |
|---|---|---|
| CN | 204836199 U | 12/2015 |
| CN | 205544597 | 8/2016 |
| CN | 205544597 U | 8/2016 |
| CN | 104081237 B | 10/2016 |
| CN | 104412541 B | 5/2019 |
| EP | 1936861 | 6/2008 |
| EP | 2120443 | 11/2009 |
| EP | 2257009 A2 | 1/2010 |
| EP | 2257009 A2 | 12/2010 |
| EP | 2432134 A1 | 3/2012 |
| EP | 2693688 | 2/2014 |
| JP | 2007049822 A | 2/2007 |
| JP | 2009534822 A | 9/2009 |
| JP | 2018093702 A | 6/2018 |
| WO | 9316407 A1 | 8/1993 |
| WO | WO199316407 A1 | 8/1993 |
| WO | WO2006127916 A2 | 11/2006 |
| WO | WO2010053542 | 5/2010 |
| WO | WO2017054030 | 4/2017 |
| WO | WO2017167926 A1 | 10/2017 |
| WO | WO2018017544 A1 | 1/2018 |
| WO | WO2019023731 A1 | 2/2019 |
| WO | WO2019212759 A1 | 11/2019 |

OTHER PUBLICATIONS http://www.strantech.com/products/tfoca-genx-hybrid-2x2-fiber-optic-copper-connector/.
http://www.qpcfiber.com/product/connectors/e-link-hybrid-connector/.
https://www.lumentum.com/sites/default/files/technical-library-items/poweroverfiber-tn-pv-ae_0.pdf.
"Network Remote Power Using Packet Energy Transfer", Eaves et al., www.voltserver.com, Sep. 2012.
Product Overview, "Pluribus VirtualWire Solution", Pluribus Networks, PN-PO-VWS-05818, https://www.pluribusnetworks.com/assets/Pluribus-VirtualWire-PO-50918.pdf, May 2018, 5 pages.
Implementation Guide, "Virtual Chassis Technology Best Practices", Juniper Networks, 8010018-009-EN, Jan. 2016, https://wwwjuniper.net/us/en/local/pdf/implementation-guides/8010018-en.pdf, 29 pages.
Yencheck, Thermal Modeling of Portable Power Cables, 1993.
Zhang, Machine Learning-Based Temperature Prediction for Runtime Thermal Management across System Components, Mar. 2016.
Data Center Power Equipment Thermal Guidelines and Best Practices.
Dynamic Thermal Rating of Substation Terminal Equipment by Rambabu Adapa, 2004.
Chen, Real-Time Termperature Estimation for Power MOSEFETs Conidering Thermal Aging Effects:, IEEE Trnasactions on Device and Materials Reliability, vol. 14, No. 1, Mar. 2014.
Jingquan Chen et al: "Buck-boost PWM converters having two independently controlled switches", 32nd Annual IEEE Power Electronics Specialists Conference. PESC 2001. Conference Proceedings, Vancouver, Canada, Jun. 17-21, 2001; [Annual Power Electronics Specialists Conference], New York, NY: IEEE, US, vol. 2, Jun. 17, 2001 (Jun. 17, 2001), pp. 736-741, XP010559317, DOI: 10.1109/PESC.2001.954206, ISBN 978-0-7803-7067-8 paragraph [SectionII]; figure 3.
Cheng K W E et al: "Constant Frequency, Two-Stage Quasiresonant Convertor", IEE Proceedings B. Electrical Power Applications,

(56) References Cited

OTHER PUBLICATIONS 1271980 1, vol. 139, No. 3, May 1, 1992 (May 1, 1992), pp. 227-237, XP000292493, the whole document.
International Search Report and Written Opinion in counterpart International Application No. PCT/US2021/024235, dated Jul. 6, 2021, 14 pages.
Bart Grabowski, "7 ASIC Integration Benefits", Sigenics, Inc., Feb. 4, 2019, 5 pages; https://www.sigenics.com/blog/7-asic-integration-benefits.
Aaron Yamell, "Point-of-Load Module Considerations", DigiKey, Aug. 17, 2016, 7 pages; https://www.digikey.com/en/articles/point-of-load-module-considerations.
English Translation and Original Office Action in counterpart Chinese Application No. 202180026193.6 dated Oct. 28, 2023, 15 pages.
English Translation and Original Office Action in counterpart Japanese Application No. 2022-552303, dated Nov. 2, 2023, 20 pages.

\* cited by examiner

INTEGRATION OF POWER AND OPTICS THROUGH COLD PLATES FOR DELIVERY TO ELECTRONIC AND PHOTONIC INTEGRATED CIRCUITS

STATEMENT OF RELATED APPLICATIONS

The present application is a continuation application of U.S. Patent Application No. 16/983,932, entitled INTEGRATION OF POWER AND OPTICS THROUGH COLD PLATES FOR DELIVERY TO ELECTRONIC AND PHOTONIC INTEGRATED CIRCUITS, filed on Aug. 3, 2020, which is a continuation-in-part of U.S. patent application Ser. No. 16/842,393, entitled INTEGRATION OF POWER AND OPTICS THROUGH COLD PLATE FOR DELIVERY TO ELECTRONIC AND PHOTONIC INTEGRATED CIRCUITS, filed on Apr. 7, 2020 and also claims priority from U.S. Provisional Patent Application No. 63/012,822, entitled INTEGRATION OF POWER AND OPTICS THROUGH MULTIPLE COLD PLATES FOR DELIVERY TO ELECTRONIC AND PHOTONIC INTEGRATED CIRCUITS, filed on Apr. 20, 2020, which are incorporated herein by reference in their entireties.

TECHNICAL FIELD

The present disclosure relates generally to power and optics integration, and more particularly, to power and optical signal distribution in an electronics and photonics package.

BACKGROUND

As ASIC (Application-Specific Integrated Circuit) process nodes advance and device power continues to increase, delivering requisite power is becoming more challenging. Higher power distribution also presents additional thermal challenges. When the ASIC or other electronic integrated circuit is packaged with a cold plate, additional difficulties arise in delivering power to the electronic integrated circuit and optical signals to a photonic integrated circuit.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
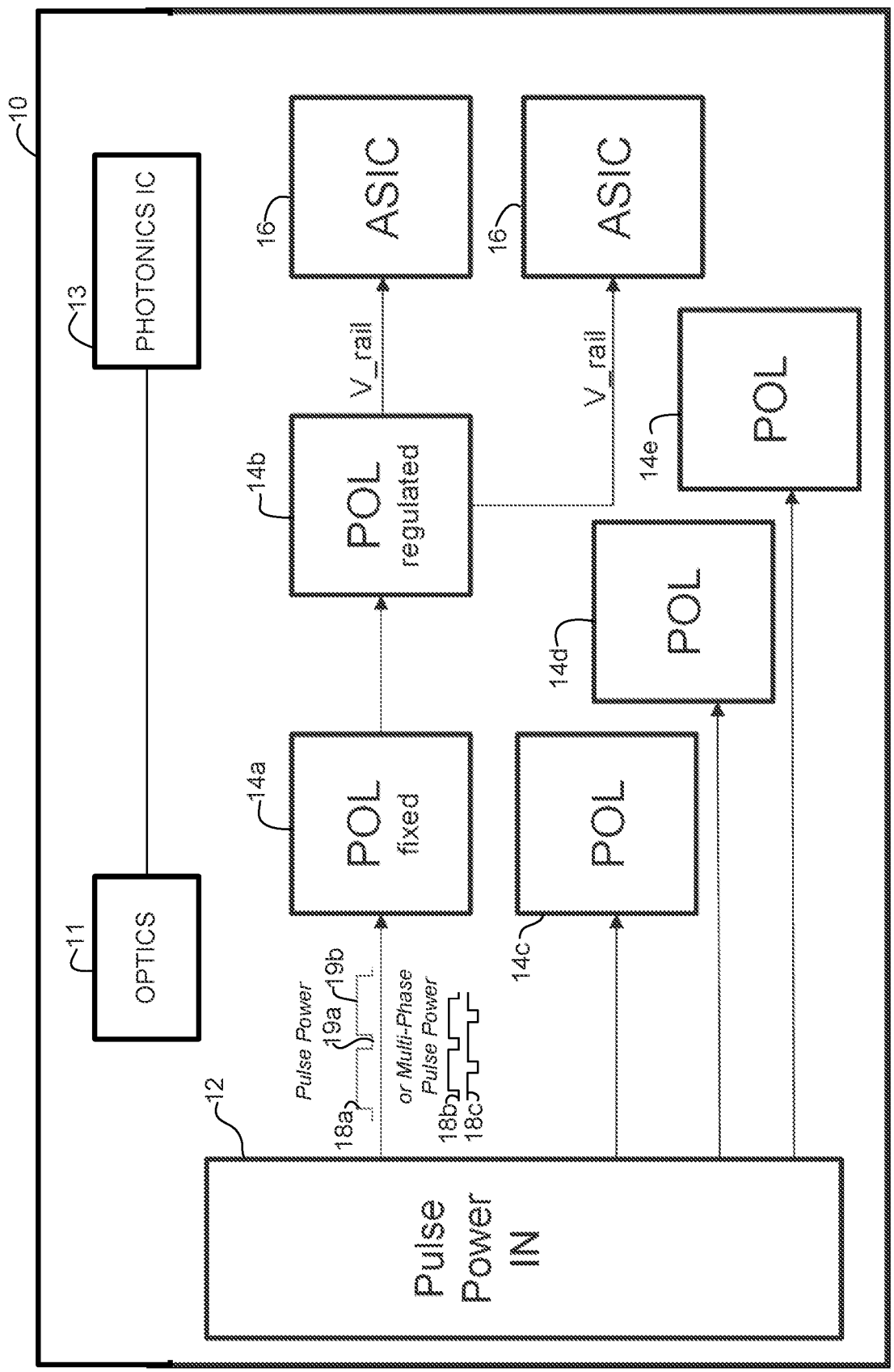
FIG. 1 is a block diagram illustrating an example of power distribution through Point-of-Load (POL) modules and transmission of optical signals.

In one embodiment, an apparatus generally comprises an upper cold plate and a lower cold plate, at least one of the upper cold plate or the lower cold plate comprising an electrical or optical path extending therethrough, a substrate and die package interposed between the upper cold plate and the lower cold plate, and a connector coupled to one of the upper cold plate or the lower cold plate for transmitting power or an optical signal through the electrical or optical path to the substrate and die package.

In another embodiment, an apparatus generally comprises a first cold plate comprising an electrical path extending therethrough, a second cold plate comprising an optical path extending therethrough, a substrate and die package comprising at least one electronic integrated circuit and at least one photonic integrated circuit, the substrate and die package interposed between the first cold plate and the second cold plate, an electrical connector coupled to the first cold plate for transmitting power or electrical signals through the electrical path, and an optical connector coupled to the second cold plate for transmitting optical signals through the optical path.

In yet another embodiment, a method generally comprises creating an electrical path and an optical path through cold plates, positioning the cold plates on opposite sides of a substrate and die package, and transmitting power through the electrical path and an optical signal through the optical path, wherein the power is transmitted from a power connector coupled to one of the cold plates and the optical signal is transmitted from or received at an optical connector coupled to one of the cold plates.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

A power distribution system may be configured to deliver power from a point-of-load (POL) to an ASIC (Application-Specific Integrated Circuit) or other integrated circuit. As power requirements increase, additional thermal considerations may be needed. In package optic applications may present additional challenges including integration of optics and delivery of optical signals without impacting cooling systems.

One or more embodiments described herein provide integration of power and optics for delivery through one or more cold plates to electronic and photonic integrated circuits (ICs) (die, ASIC, chip). As described in detail below, one or more electrical paths and optical paths are formed in cold plates to allow power to pass from the POL to electronic components coupled to the substrate and optical signals to pass through the cold plate to photonic elements. The cold plate may comprise, for example, a power delivery block (e.g., PCB (Printed Circuit Board)) with one or more power vias for transferring power through the cold plate and one or more openings for defining an optical path. The optical path may comprise one or more optical elements (e.g., waveguide, mirror, or other optics) for transmitting an optical signal through the cold plate and directing the optical signal to or from the photonic integrated circuit. As described in detail below, the optical path may be coupled to a connector positioned on the cold plate for receiving or transmitting the optical signal. The connector may also be configured for receiving power (e.g., multi-phase pulse power), which may be delivered to the POL for distribution through the cold plate.

The embodiments described herein operate in the context of a data communications network including multiple network devices. The network may include any number of network devices in communication via any number of nodes (e.g., routers, switches, gateways, controllers, edge devices, access devices, aggregation devices, core nodes, intermediate nodes, power sourcing equipment, powered devices, or other network devices), which facilitate passage of data within the network. One or more of the network devices may comprise one or more power and optics distribution systems described herein. The network device may further include any combination of memory, processors, power supply units, and network interfaces.

Referring now to the drawings, and first to FIG. 1, a block diagram illustrating an example of power distribution through a POL power supply located on a board 10 is shown, in accordance with one embodiment. As described in detail below optics 11 is integrated with the power system and an optical path is created to transmit optical signals through the cold plate and substrate to or from a photonic chip 13 (photonic die, photonic integrated circuit, integrated optical circuit, optical engine) integrating multiple photonic functions.

Power is delivered at element 12 to a plurality of POLs (POL modules (circuits), power components) 14a, 14c, 14d, 14e. In one example, pulse power at a voltage greater than 100V (e.g., 108V, 380V) or any other suitable voltage, is delivered to the fixed POL 14a. The power source 12 may also deliver pulse power to POLs 14c, 14d, and 14e (e.g., fixed POLs). In another example, the power source 12 delivers 54 VDC (or any other suitable voltage (e.g., intermediate bus voltage level selected based on overall system efficiency, routeability, and cost)) to POL modules 14c, 14d, 14e. The fixed POL 14a transfers power (e.g., at 54 VDC or other voltage) to the regulated POL (POL converter, POL regulator) 14b, which distributes power to ASICs 16 (e.g., integrated circuit, die, chip, multi-chip module (MCM), and the like). As described below, the fixed POL 14a may be connected to the regulated POL 14b through a bus bar interconnect or any other suitable electrical connection. The regulated POL 14b may provide, for example, 150 amp or greater output. Each power connection may also include 10 Mbps (or any other data rate) communications. In the example shown in FIG. 1, power is delivered from the regulated POL module 14b to the ASICs 16 via a voltage rail. Power may be provided to the ASICs 16 in a multi-drop arrangement, for example.

It is to be understood that the term "POL module" as used herein may refer to various types of POL configurations, including, for example, discrete POLs and modules or power delivery block-based voltage regulator designs. Also, it may be noted that the POLs may be single phase or multi-phase POLs that may work together to deliver one or more output.

System components (POL modules, cold plates, electronic and photonic package (substrate and die package)) are connected to the board 10. The board 10 may comprise a printed circuit board or the components may be directly attached to sheet metal modules, a line card, or any other suitable support member. For example, a line card circuit board may be removed and the electronic package interconnected through fiber and copper connections at the ASIC edge.

As previously noted, pulse power may be supplied to one or more of the POL modules. The term "pulse power" (also referred to as "pulsed power") as used herein refers to power that is delivered in a plurality of voltage pulses (sequence of voltage pulses) 18a in which voltage varies between a very small voltage (e.g., close to 0V, 3V) during a pulse-off time 19a and a larger voltage (e.g., ≥12V) during a pulse-on time 19b. High voltage pulse power (high voltage pulses) (e.g., >56V, ≥60V, ≥300V, ~108 VDC, ~380 VDC) may be transmitted from power sourcing equipment (PSE) to a powered device (PD) for use in powering the powered device, whereas low voltage pulse power (low voltage pulses) (e.g., ~12V, ~24V, ≤30V, ≤56V) may be used over a short interval for start-up (e.g., initialization, synchronization, charging local energy storage, powering up a controller, testing, or any combination thereof). For example, high voltage pulse power may be transmitted from power sourcing equipment to a powered device for use in powering the powered device, as described in U.S. patent application Ser. No. 16/671,508 ("Initialization and Synchronization for Pulse Power in a Network System"), filed Nov. 1, 2019, which is incorporated herein by reference in its entirety. Pulse power transmission may be through cables, transmission lines, bus bars, backplanes, PCBs (Printed Circuit Boards), and power distribution systems, for example.

In one or more embodiments, the pulse power may be delivered in multiple phases (18b, 18c in FIG. 1), with the pulses offset from one another between phases to provide continuous power. One or more embodiments may use multi-phase pulse power to achieve less loss, with continuous uninterrupted power with overlapping phase pulses to a powered device, as described in U.S. patent application Ser. No. 16/380,954 ("Multiple Phase Pulse Power in a Network Communications System"), filed Apr. 10, 2019, which is incorporated herein by reference in its entirety.

It is to be understood that the voltage, power, and current levels described herein are only provided as examples and power may be delivered at different levels (volts, amps, watts) than described herein without departing from the scope of the embodiments. Power may be received as ESP (Extended Safe Power) (also referred to as FMP (Fault Managed Power)) (e.g., pulse power, multi-phase pulse power, pulse power with fault detection and safety protection), PoE (Power over Ethernet), or in accordance with any current standard or future standard.

The term ESP (or FMP) as used herein refers to high power (e.g., >100 Watts (W)), high voltage (e.g., ≥56 Volts (V)) operation with pulse power delivered on one or more wires or wire pairs in a cable (e.g., Ethernet cable). In one or more embodiments, ESP includes fault detection (e.g., fault detection at initialization and between high voltage pulses), and pulse synchronization. As shown in FIG. 1, pulse power or multi-phase pulse power may be received at the fixed POL module 14*a*. As described below with respect to FIG. 6, the pulse power may be received at a connector mounted on a cold plate and transmitted to the fixed POL module through an interconnect.

Figure 2:
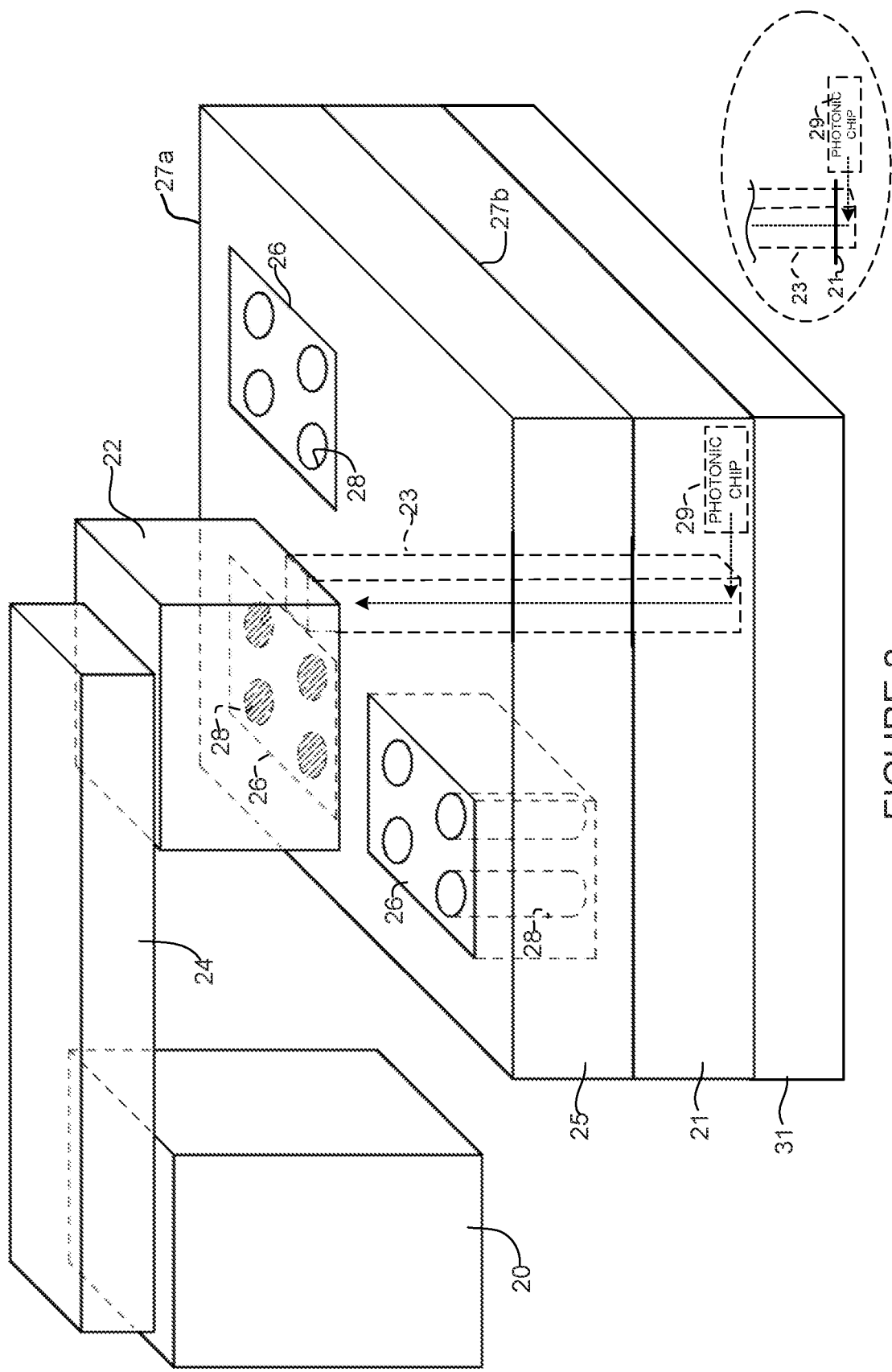
FIG. 2 is a schematic perspective of the POL modules and a cold plate comprising power blocks with power vias for delivery of power from the POL modules and an optical path for transmission of an optical signal through the cold plate, in accordance with one embodiment.

FIG. 2 is a perspective schematic illustrating a connection between a fixed POL 20 and a regulated POL 22, distribution of power through a cold plate 25, and transfer of optical data through the cold plate and a substrate and die package 21, in accordance with one embodiment. The fixed POL module 20 may provide input power to the regulated POL module 22 via an electrical connection 24 comprising, for example, a bus bar, wire, or other interconnect. For simplification, only one POL module 22 is shown connected to the cold plate 25, however, any number of POL modules may be connected to the cold plate. Each POL may provide a single voltage rail or multiple voltage rails, as shown in FIG. 1. In the example shown in FIG. 2, an optical path 23 extends through the cold plate 25 and substrate for transmitting optical signals through the cold plate.

In one or more embodiments, an apparatus comprises the cold plate 25 comprising a first side 27*a* (upper surface as viewed in FIG. 2) and a second side 27*b* (lower surface) opposite to the first side, a photonic integrated circuit (chip) 29 connected to the substrate (e.g., printed circuit board, interposer, printed circuit board and interposer) positioned on the second side of the cold plate, and the optical path 23 extending through the cold plate 25 and the substrate (extending into the substrate and die package 21) and optically coupled to the photonic integrated circuit for transmitting an optical signal between the first side of the cold plate and the photonic integrated circuit.

The term "substrate and die package" as used herein may refer to one or more electronic or photonic integrated circuits coupled to one or more substrates (printed circuit board, electrical board, ceramic board). One or more of the electronic or photonic integrated circuits may be attached to one or more sides of the substrate. For example, as described below with respect to FIGS. 13 and 14, an optical engine or SerDes (serializer/deserializer), may be mounted on both sides of the substrate. The term "integrated circuit" as used herein may refer to an electronic integrated circuit, photonic integrated circuit, ASIC, optical engine, die, silicon die, chip, chiplet, SerDes circuit (chip), and the like.

Optical path 23 is created to allow light (indicated by arrow in optical path) to pass through the cold plate 25 and substrate to reach the optical engine (photonic integrated circuit, chip, die) 29. In the example shown in FIG. 2, the photonic chip 29 is located below the substrate in the substrate and die package (described below with respect to FIG. 3). In another example, the photonic chip 29 may be located above the substrate (adjacent to the cold plate) in which case the optical path 23 does not need to extend through the substrate of the substrate and die package 21, as illustrated in the alternate view shown in dashed outline in FIG. 2. The optical path 23 may comprise, for example, one or more waveguides or an opening for receiving fiber optics. In one or more embodiments, the optical path 23 may be configured for light, laser written waveguides in glass, free space optics, or optical fiber, for example. A cutout may be made in the cold plate and substrate with passageway 23 inserted therein to link POL module 22 and bus bar 24 to the photonic chip 29. In one example, optics are integrated with power delivery over bus bar 24. The optical path 23 may be aligned and optically coupled to the photonics die 29 and module 22 as shown in FIG. 2, or may interconnect with a connector having interlocking features, as described below with respect to FIGS. 6 and 8A. The optical path 23 may be attached to the chip 29 using active or passive alignment processes and adhesive, such as an index matching epoxy, as described below with respect to FIG. 5. As described below with respect to FIGS. 4A-4D, the optical path may also be coupled to an edge, top, or bottom of the die 29. Various coupling approaches may be used including, for example, edge coupling, vertical coupling, etc.

In one or more embodiments, the optical path 23 may be part of a dedicated cutout separate from the electronics as shown in FIG. 2. In one or more embodiments, the optical path and electrical path may be defined along the same cutout in the cold plate 25. For example, a piece of glass may be laser patterned with waveguides and plated with metal vias to form a combined optical path and electrical path. Also, more than one optical path 23 may be formed in the cold plate 25 and substrate to communicate with one or more photonic die 29.

In one or more embodiments, the optical path 23 may be constructed from an optical bulk material (e.g., $SiO_2$ or other suitable material) in which a plurality of waveguides and mirrors are defined, as described in U.S. patent application Ser. No. 16/546,084 ("Periscope Optical Assembly"), filed on Aug. 20, 2019, which is incorporated herein by reference in its entirety. The optical path 23 may comprise an optical path structure (e.g., periscope optical assembly) comprising, for example, one or more waveguide, mirror, lens, optical grating, filter, or any combination thereof. The optics may be defined by various processes in the bulk material based on the refractive index and the angle of light passing from one region to another. For example, a waveguide may be defined to confine light to a predefined path in the bulk material, whereas optics (e.g., a mirror) may redirect light received in one direction to a second direction. Other optics may have other effects on light carried in the bulk material, such as a lens focusing/converging or diffusing/diverging incoming light, an optical grating splitting and diffracting light into several beams, a filter removing, blocking, attenuating, or polarizing certain wavelengths of light, etc. Laser patterning may be used to define paths of the waveguide and a physical or chemical etching process may be used to form the mirror. The mirror may be defined, for example, as three-dimensional reflective structures within the bulk material or the mirror may be defined via a reflective surface treatment. It may also be noted that the optical path 23 may be formed from one piece or multiple pieces combined together as described below with respect to FIGS. 4A-4D. It is to be understood that these are only examples and other processes may be used to define optics within the optical path 23 or other optical components may be used, without departing from the scope of the embodiments.

An example of a fabrication process for creating the optical path 23 in the cold plate and substrate is described below with respect to FIGS. 4A-4D.

As previously described, in addition to providing the optical path 23 through the cold plate 25, one or more electrical paths 28 may be created in the cold plate. As shown in the example of FIG. 2, the cold plate 25 comprises a plurality of power delivery blocks 26 each comprising a plurality of power vias (electrical paths) 28 for transmitting power through the cold plate, from the POL module 22 to an electronic package 21 (substrate and die package) (described below with respect to FIG. 3). Power is transmitted from a first side of the cold plate 25 (e.g., upper surface 27a as shown in FIG. 2) to a second side (e.g., lower surface 27b as shown in FIG. 2) of the cold plate opposite and generally parallel to the first side. In one or more embodiments, the power delivery block 26 comprises a small (miniature) power printed circuit board. Based on the application, other components may also be inserted into the cold plate 25 or strategically placed cutouts may be used.

The power delivery block 26 comprises a plurality of through holes (vias) 28, which extend through the entire thickness of the power delivery block (as shown in phantom in FIG. 2) and are plated along their interior surfaces. The through hole may, for example, be created using a drilling process and plated with a metallic material (e.g., copper or any conductive or metallic layer). The plating may effectively cover the barrel of the hole and create the electrical path 28 through the cold plate 25.

The term "power delivery block" as used herein may refer to any block of thermal and conductive material in which electrical paths (e.g., power vias) may be formed to allow for the passage of power directly through the cold plate 25. Although the term "printed circuit board" is used herein as an example of a substrate for the power delivery block 26, in other implementations the PCB may be replaced with other substrates (e.g., ceramic circuit boards) or other elements. Also, non-printed circuit boards may be used for the power delivery block 26. For example, a piece of glass may be laser patterned with waveguides and plated with metal vias to form a combined optical path and electrical path. Also, as previously noted, other components in addition to or instead of the PCB may be inserted into the cold plate 25.

The cold plate 25 may comprise, for example, liquid, gas, or multi-phase (multi-phase cold plate) based cooling. The through power vias 28 may deliver 10 amps per tube, for example, and may be cooled by the cold plate 25. In one or more embodiments, the cold plate 25 is formed with one or more openings for insertion of one or more power delivery blocks 26, which may be, for example, press fit into the cold plate 25. An epoxy resin or adhesive fill may be used to press and position the power delivery block 26 within the cold plate 25. The epoxy resin may be used to account for tolerances between the power delivery block 26 and cold plate opening. If the cold plate 25 utilizes cooling tubes or reservoirs, these are routed or positioned around the power delivery block and optical path openings. The cold plate 25 keeps a temperature rise low for the power vias 28, thereby maximizing current transfer from the POL 22 to the substrate and die package. In one example, the cold plate 25 is configured with multiple internal zones to maintain optical temperature below 75 degrees Celsius. It is to be understood that the cold plate and temperature described herein are only examples and other designs may be used to maintain cooling at different temperatures.

In one or more embodiments, the power block, power vias, and cold plate may be configured as described in U.S. patent application Ser. No. 16/743,371 ("Power Distribution from Point-of-Load With Cooling"), filed Jan. 15, 2020, which is incorporated herein by reference in its entirety.

The power delivery blocks 26 and vias 28 formed therein extend through the cold plate 25 to provide power to the attached substrate and die package 21. For simplification, only a portion of the power delivery blocks 26 and vias 28 are shown in phantom extending through the cold plate 25. Also, the substrate and die package 21 is shown as a single block structure, but it is to be understood that the package may comprise one or more substrates with any number of components (e.g., electronic integrated circuit, ASIC, photonic integrated circuit, optical engine, die, chip, chiplet, FAU (Fiber Attachment (Array) Unit), CAU (Copper Attachment (Array) Unit)) attached thereto, as described below with respect to FIG. 3.

In one or more embodiments, an additional cold plate 31 may be used, with the substrate and die package 21 interposed between the two cold plates 25, 31 to provide additional cooling. It may be noted that use of the second cooling plate 31 is optional based on power and cooling requirements. Also, it is to be understood that the cold plate 25, 31 may comprise any number of individual cold plates. For example, the cold plate may comprise two or more smaller cold plates with one or more of the power delivery block, electrical path, or optical path interposed therebetween.

In addition to passing power through the power delivery block 26, communications (e.g., control plane communications) may also pass through the power delivery block. Thus, the electrical paths may transmit power or electrical signals therethrough. In one or more embodiments, control communications for the regulated POL and for the ASIC to a system FPGA (Field-Programmable Gate Array) may pass through the cold plate 25 or through ribbon cables. In one or more embodiments, communications may pass through communication vias (not shown) formed in the power delivery blocks, which may include both power vias and communication vias or only communication vias. In one example, lower speed communications may pass through the POL (e.g., 200 Mbps range). The cold plate 25 may include any combination of power delivery blocks with power vias, communication vias, or optical paths. Control plane communications may also be provided through separate communications elements (e.g., via ribbon cable or other means), which may be used to move control communications in and out of the package. In one or more embodiments full speed PCIe (Peripheral Component Interconnect express) or faster may be used. The cold plate 25 may be connected to any number or combination of POL modules 22 and communication modules.

It is to be understood that the configuration shown in FIG. 2 is only an example, and the cold plate may include any number, combination, or arrangement of power blocks 26, optical paths 23, and communication paths.

It should be noted that the terms lower, upper, bottom, top, below, above, horizontal, vertical, and the like, which may be used herein are relative terms dependent upon the orientation of the package and components and should not be interpreted in a limiting manner. These terms describe points of reference and do not limit the embodiments to any particular orientation or configuration. For example, the assembly shown in FIG. 2 may be rotated 180 degrees (flipped vertically) and the POL module 22 mounted on an outer surface of a lower cold plate. Also, as described in detail below with respect to FIGS. 10-14, power and optical signals may be transmitted through both cold plates, in which case the module 22 will be mounted on the outer surface (surface not adjacent to substrate and die package 21) of both cold plates 25, 31, with electrical paths 28 and optical path 23 in both cold plates 25, 31.

Figure 3:
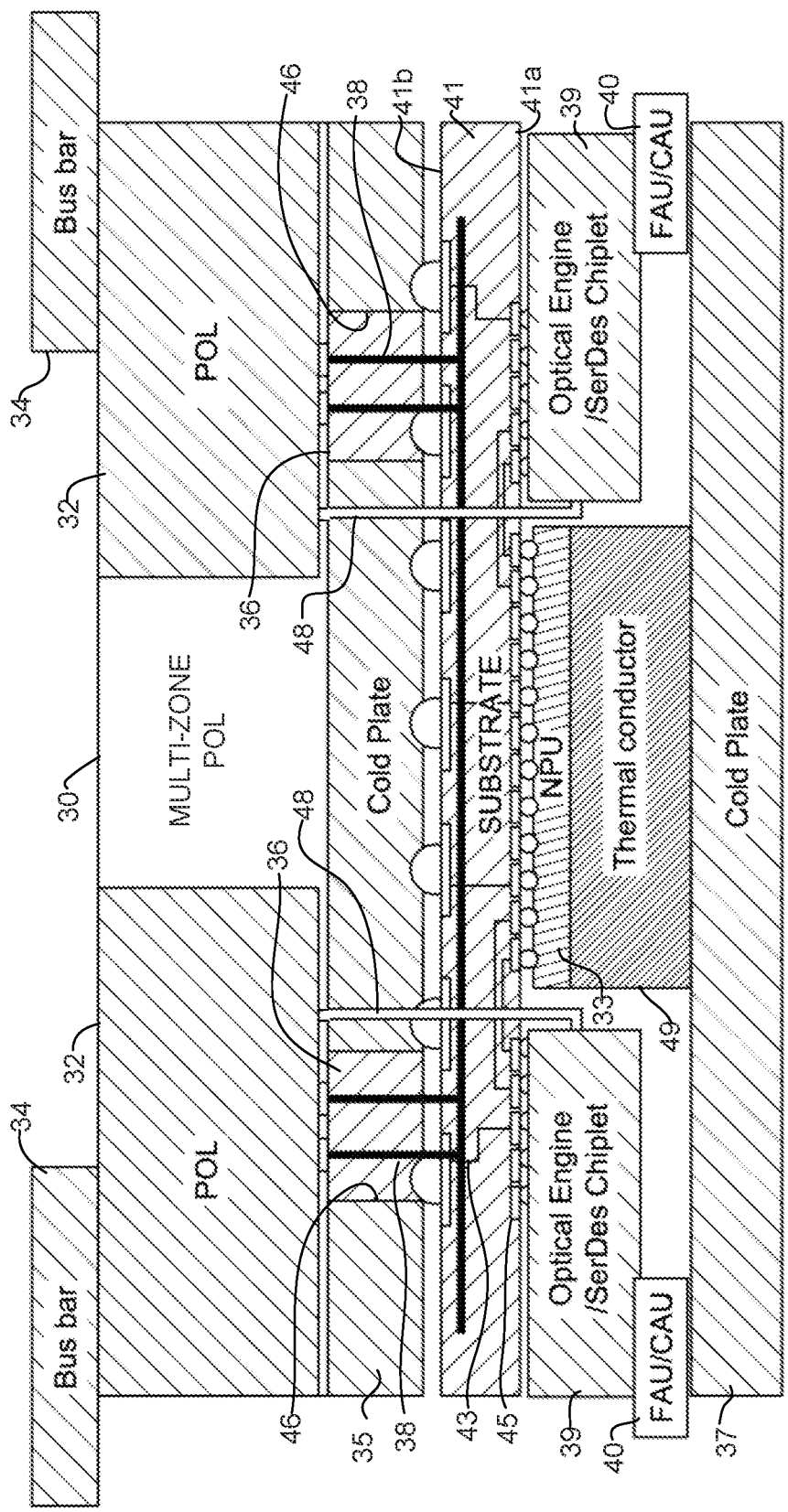
FIG. 3 is a cross-sectional schematic of the POL modules and a substrate and die package interposed between two cold plates, in accordance with one embodiment.

Referring now to FIG. 3, a cross-sectional schematic illustrates an apparatus comprising a substrate 41 having a first surface 41a and a second surface 41b opposite to the first surface, integrated circuits (one or more die (chip)) 33, 39 attached to the first surface of the substrate, and a cold plate 35 attached to the second surface of the substrate and comprising an electrical path (e.g., power via) 38 extending therethrough for transmitting power from a power component (e.g., POL module) 32 to an electronic integrated circuit 33 and optical paths 48 for transmitting one or more optical signals to or from a photonic integrated circuit (photonic chip, optical engine) 39. The term "substrate" as used herein may refer to an electrical board, ceramic board, or an element formed from any other suitable material. As described below, the substrate may also comprise an interposer (e.g., glass element laser patterned with waveguides and plated with metal vias to form a combined optical path and electrical path).

Bus bars 34 are shown connected to a multi-zone POL 30 (e.g., with DC power to rail voltage) with POL modules 32 attached to the cold plate 35 and configured to distribute power from the POL modules to an electronic and optical package comprising the substrate 41, the electronic integrated circuit 33 (ASIC, NPU (Network Processing Unit), die, chip), and two optical engines (photonic integrated circuits) 39 (SerDes (Serializer/Deserializer) chiplet) attached to the substrate. The electronic and optical package (also referred to herein as a substrate and die package) may comprise one or more integrated circuit, ASIC, NPU, MCM, die, chip, chiplet, processor, electronic component, or photonic component attached to one or more substrates. In the example of FIG. 3, the substrate and die package includes the substrate 41, NPU 33, optical engines 39 and FAU/CAU 40. It is to be understood that this is only an example and the substrate and die package may include any number of components in any arrangement. The FAU/CAU 40 may be attached to a lower surface of the optical engine 39 (as shown in FIG. 3) or positioned on an upper surface or side of the optical engine 39, or may be removed if optics and power are transmitted by another means. In the example of FIG. 3, a second cold plate 37 is thermally coupled to the NPU 33 through a thermal conductor (interposer) 49. The thermal conductor (or a plurality of thermal conductors) may be positioned across multiple die. One or more embodiments may also include an optional lid between the multi-chip module and the cold plate 37.

In the example shown in FIG. 3, two optical paths 48 extend through the cold plate 35 and substrate 41 and are optically coupled to a side of the photonic chips 39. As described below with respect to FIGS. 4A-4D, the optical path 48 may also be coupled to the photonic chip 39 along a lower edge of the chip. As previously described with respect to FIG. 2, optical signals may be transmitted along with power at the POL module 32.

As previously described, the cold plate 35 includes one or more power delivery blocks 36 (e.g., PWR PCB) inserted into the cold plate, with one or more electrical paths (power vias) 38 formed therein. In one or more embodiments, the power delivery blocks 36 are formed separately from the cold plate 35 and inserted into openings 46 formed in the cold plate for receiving the blocks. As discussed above, an epoxy resin or adhesive fill may be used to press and position the power delivery blocks 36 within the openings 46 in the cold plate 35.

The substrate 41 may comprise traces 43 and pads 45 embedded within or deposited on the substrate for connection with the power vias 38 and die 33, 39. Etching, deposition, bonding, or other processes may be used to form the traces and pads. The substrate 41 may be bonded to the cold plate 35 using solder processes, as well known by those skilled in the art.

It is to be understood that the components and arrangement shown in FIG. 3 is only an example and other types or number of components with different sizes and arrangement, or additional components may be used without departing from the scope of the embodiments. For example, one or more integrated circuits may be positioned on an upper surface of the cold plate 35 (side opposite the substrate 41). In one or more embodiments, the cold plate 35 may only include the optical path 48 with electrical power being supplied to the electronic integrated circuit (NPU) 33 via another path.

Also, as previously noted, the terms lower, upper, bottom, top, below, above, and the like, are relative terms dependent upon the orientation of the package. Thus, the cold plate 35 may be the "lower cold plate", with the optical and electrical paths extending upward through the cold plate to the substrate and die package. As described below, the optical and electrical paths may be in both cold plates for power and optical signal distribution from both sides of the substrate and die package. As described below, the optical engine 39 may also be positioned on an upper surface of the substrate 41.

Referring now to FIGS. 4A-4D a fabrication process for the optical path is shown, in accordance with one embodiment. In this example, an interposer (e.g., glass interposer) 51 is positioned between the substrate 41 and photonic integrated circuit 39. The glass interposer 51 may include any number of optical or electrical connections between the substrate 41 and the photonic integrated circuit 39. The connections may include, for example, one or more power connections (e.g., conductive vias) 44, one or more high-speed signal connections, or any combination thereof. The interposer 51 may be formed from an optically transmissive material, such as a silicate glass, quartz, or any other suitable material. The interposer 51 may be coupled with the substrate 41 through any suitable surface mounting technique. Solder balls may be attached to the interposer 51 and couple with circuitry of the substrate 41 in a ball grid array, for example. The photonic chip 39 is attached to the interposer 51 through any suitable means (e.g., bonding). In one or more embodiments, the photonic integrated circuit 39 may be coupled with the interposer 51 as described in U.S. Pat. No. 10,393,959 ("Photonic Integrated Circuit Bonded with Interposer"), issued Aug. 27, 2019, for example. An electronic integrated circuit 53 is also shown coupled to the photonic integrated circuit 39 in the example shown in FIGS. 4A-4D.

It is to be understood that the term "substrate" as used herein with respect to FIGS. 4A-4D may refer to multiple elements (e.g., printed circuit board 41 and interposer 51) or a single element or board.

Figure 4A:
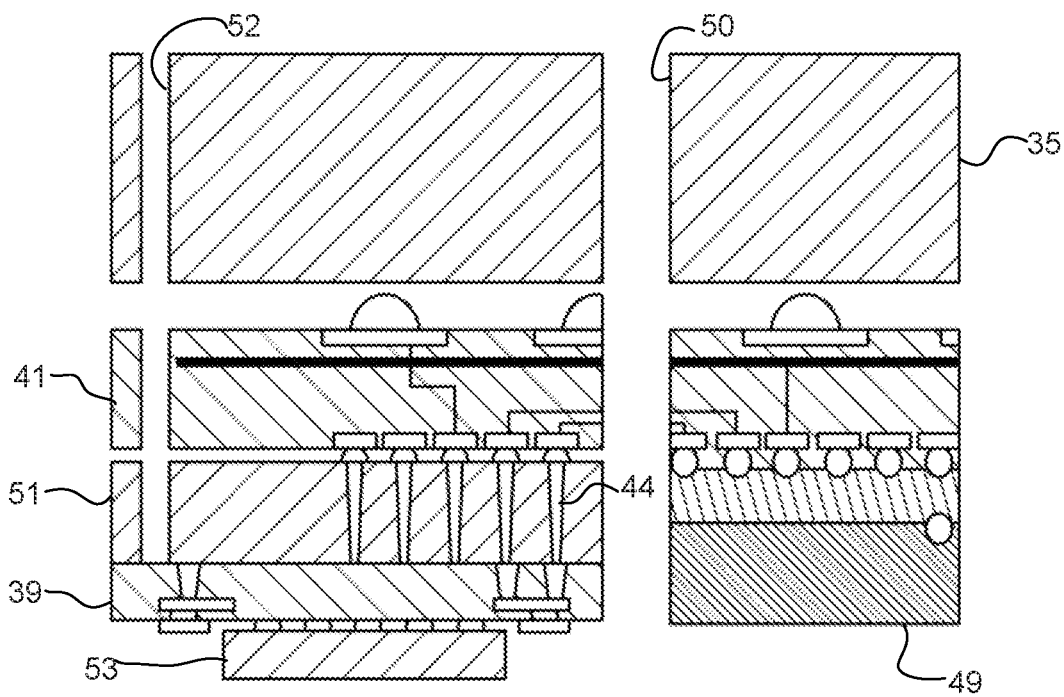
FIGS. 4A-4D are cross-sectional schematics illustrating a fabrication process for creating the optical path through the cold plate, in accordance with one embodiment.

Referring first to FIG. 4A, a cross-sectional schematic is shown illustrating a first opening 50 passing through the cold plate 35 and substrate 41. As described below with respect to FIG. 4B, opening 50 is used to insert an optical path structure for communication with the photonics chip 39 along an edge of the chip. A second opening 52 is shown extending through the cold plate 35, substrate 41, and interposer 51 for receiving an optical path structure for communication with the photonic chip 39 through an upper surface of the chip. For simplification, the schematic is shown with the cross-section passing through the openings 50, 52, without the material behind the openings shown. In one or more embodiments, vertical or edge coupling may be used to attach optics to the photonic die 39. It is to be understood that while placement of two different optical paths are shown in FIGS. 4A-4D for illustration purposes, only one of the paths may be used to provide an optical path through the cold plate 35 and substrate 41. In one or more embodiments, the interposer 51 may be shortened so that the opening 52 passes through the cold plate 35 and substrate 41, and along a side the interposer 51. Also, in one or more embodiments, an optical path may extend through the cold plate 35 and along an outer edge of the substrate 41 and interposer 51 and couple with a lower side of the photonic die 39 through the use of optics redirecting light towards the lower side of the die.

The optical engines (photonic integrated circuits, photonic dies, photonic chips) 39 may be first attached to the interposer 51 and substrate 41, which is then attached to the cold plate 35. The cutouts 50, 52 may then be formed in the cold plate 35, substrate 41, and interposer 51 to accommodate the optical path. In one or more embodiments, a sleeve (not shown) may be inserted into the openings, which may be formed using any suitable process.

Figure 4B:
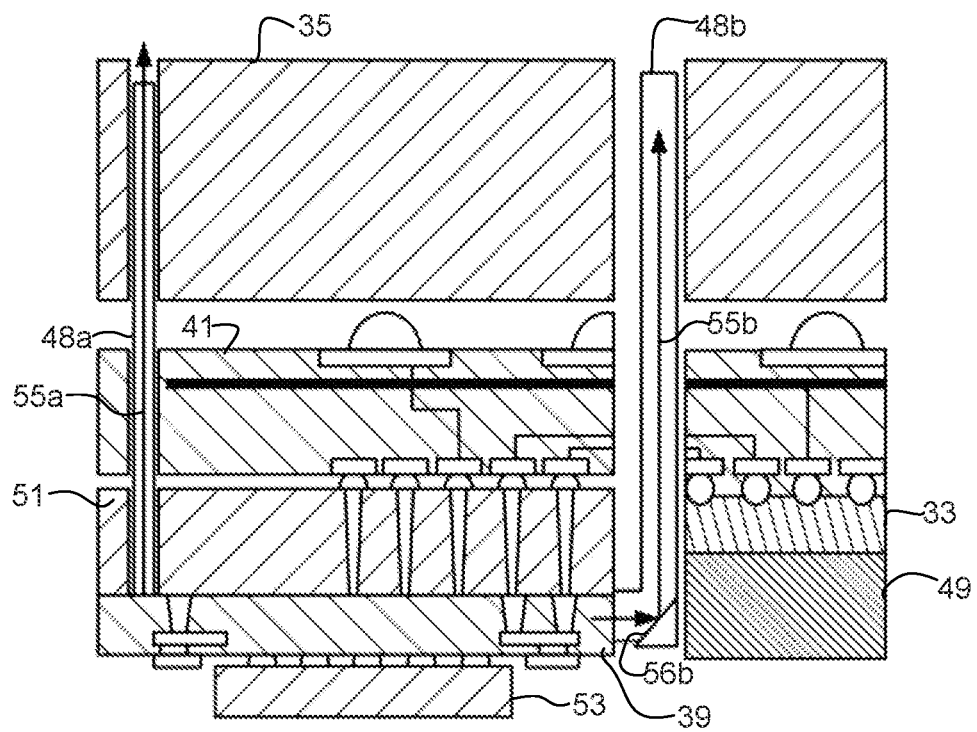

As shown in FIG. 4B, optical paths (optical path structures) 48a, 48b are positioned in the openings 52, 50 and attached to the photonic die 39 to optically couple the photonic die to the optical path. The optical path 48a, 48b may be attached using active alignment, precise passive alignment, UV/thermal cure epoxy, or any other suitable process. Further details of an attachment method are described below with respect to FIG. 5. Depending on where the optical connection is located on the die 39 (e.g., side or top as viewed in FIGS. 4A-4D) and whether the light comes out on a surface or from the side of the die, the optical path may attach to the surface of the die (as shown for optical path 48a) or one of the edges (as shown for optical path 48b). The optical paths 48a, 48b each comprise a waveguide 55a, 55b defined to confine light to a predefined path. Optical path 48b includes a mirror (optics) 56b for redirecting light received in one direction to a second direction. As previously noted, each optical path 48a, 48b may comprise other optical components such as a lens for focusing/converging or diffusing/diverging incoming light, an optical grating for splitting and diffracting light into several beams, or a filter for removing, blocking, attenuating, or polarizing certain wavelengths of light.

Figure 4C:
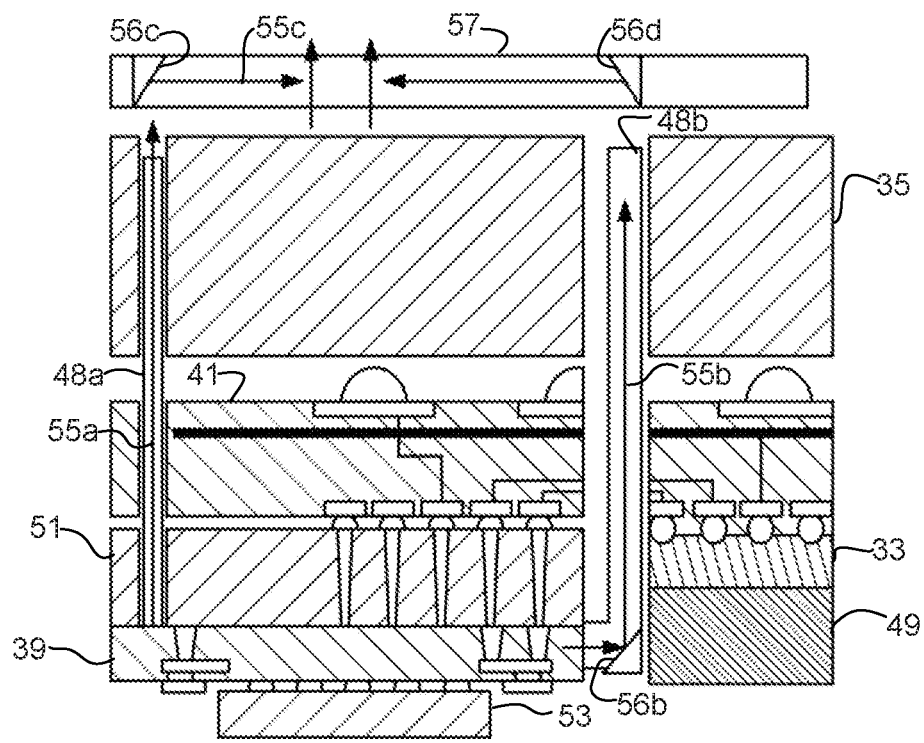
Figure 4D:
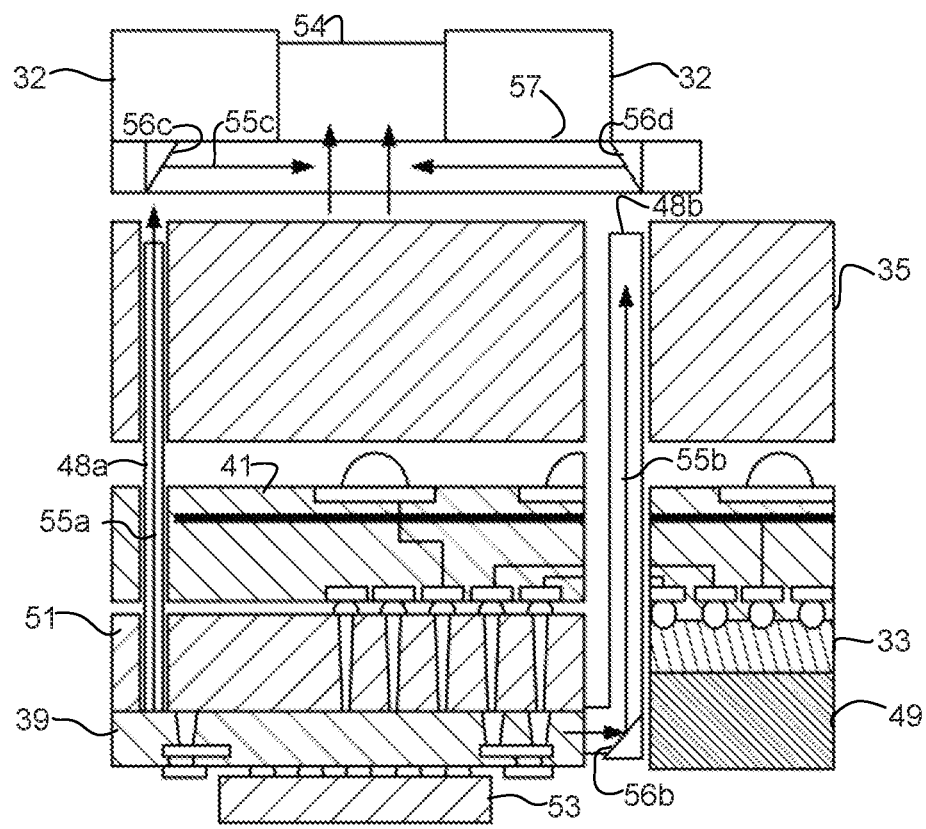

As shown in FIG. 4C, in order to simplify manufacturing, the optical path 48a, 48b may plug in or connect to another optical path (e.g., periscope/routing structure) 57 to combine all of the optical signals. Optical path structure 57 includes waveguide 55c and mirrors 56c, 56d for redirecting light from the optical paths 48a, 48b to an optical connector 54 (FIG. 4D). Strain relief epoxy or filler material may be used to further support the optical path structures. Index matching epoxy may also be used in the optical path to improve coupling at the connections between the optical paths.

FIG. 4D illustrates the completed assembly with the POL modules 32, optical connector 54, and remaining mechanical components attached to complete the package. Optical path 57 may include additional mirrors (not shown) to redirect light into the connector 54.

As previously described, the optical paths may also extend through a lower cold plate positioned adjacent to the photonic chip 39, in which case the optical path may be coupled directly to the photonic chip, without passing through the substrate 41 or interposer 51.

It is to be understood that the optical paths shown and described herein are only examples and the structures may be configured or manufactured different than described or shown without departing from the scope of the embodiments. As previously noted, multiple optical paths may be attached or plugged together to create an optical path between an upper surface of the cold plate and the photonic die. The optical path may be formed from various materials (e.g., glass, heat-resistant polymers, etc.) using various processes. In one example, laser patterning of glass may be used to write waveguides and precisely write and etch mechanical features such as plugs for interlocking slots (described below with respect to FIG. 5). Laser patterning may also be used to pattern other glasses such as gorilla glass (chemically strengthened glass) or flexible glass. As previously noted, mirrors, lenses, or other optics may also be patterned into the optical path. An electrical via with plated metal may also be created in the laser patterned structure to allow electrical signals to be routed in the same structure as the optical signals.

Figure 5:
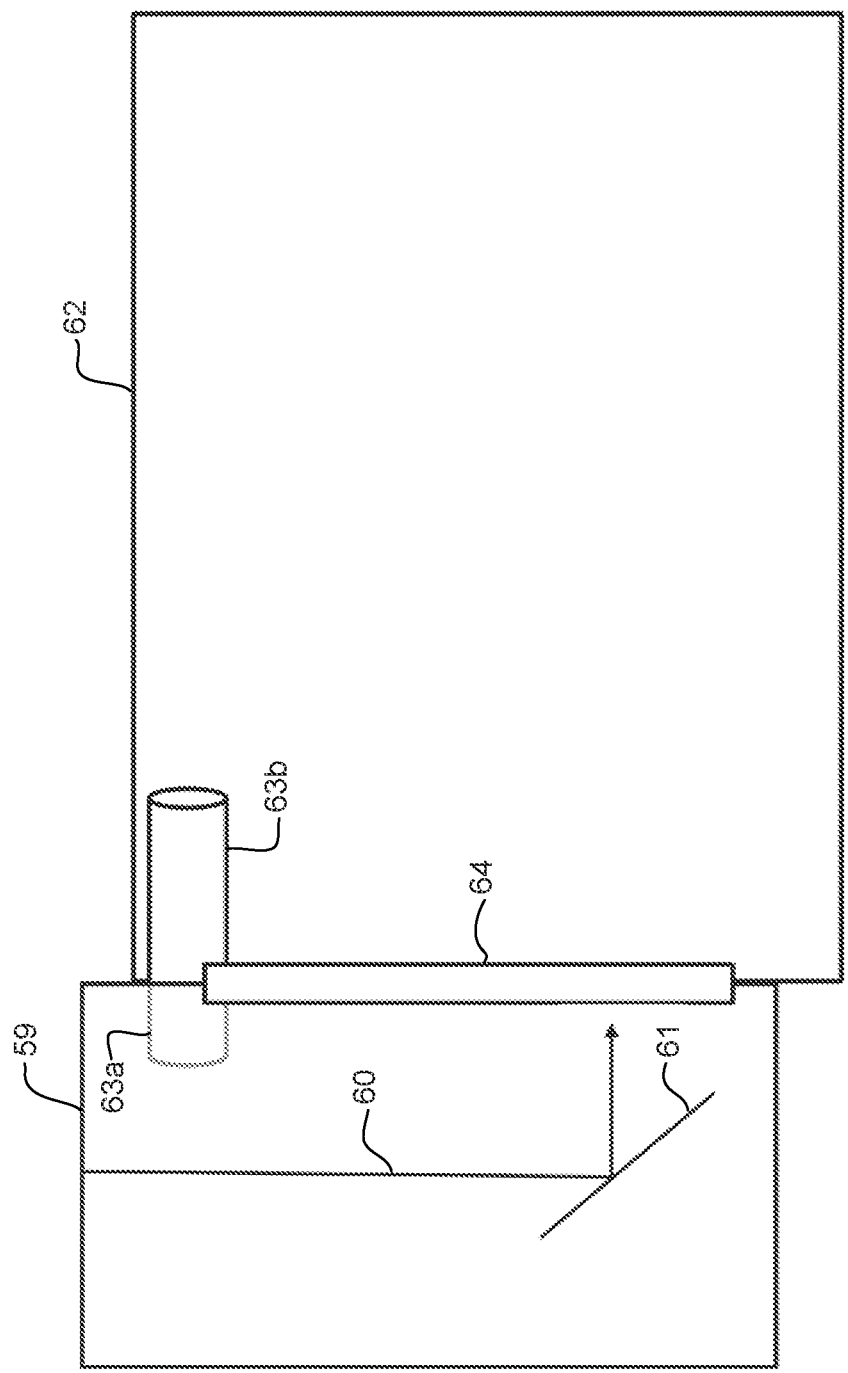
FIG. 5 is a schematic illustrating attachment of an optical path to the substrate and die package, in accordance with one embodiment.

FIG. 5 illustrates an example of an optical path 59 with an etched mirror 61 and an opening 63a for use in aligning the optical path with an interposer and photonic chip assembly 62. The optical path 59 includes a waveguide 60, mirror 61, and opening 63a for receiving the alignment pin 63b for attachment to the interposer and photonic chip assembly 62. An index matching epoxy 64 may be used to hold the plug in place and ensure coupling between the plug 63b and the optical path (e.g., periscope) 59. Also, more than one alignment pin may be used. As previously described, active alignment may be used to attach the optical path 59 with the alignment pin 63b used for coupling the optical path to the interposer or another optical path. For embodiments in which edge coupling may not be used, the optical path may be attached by vertical or evanescent coupling.

Figure 6:
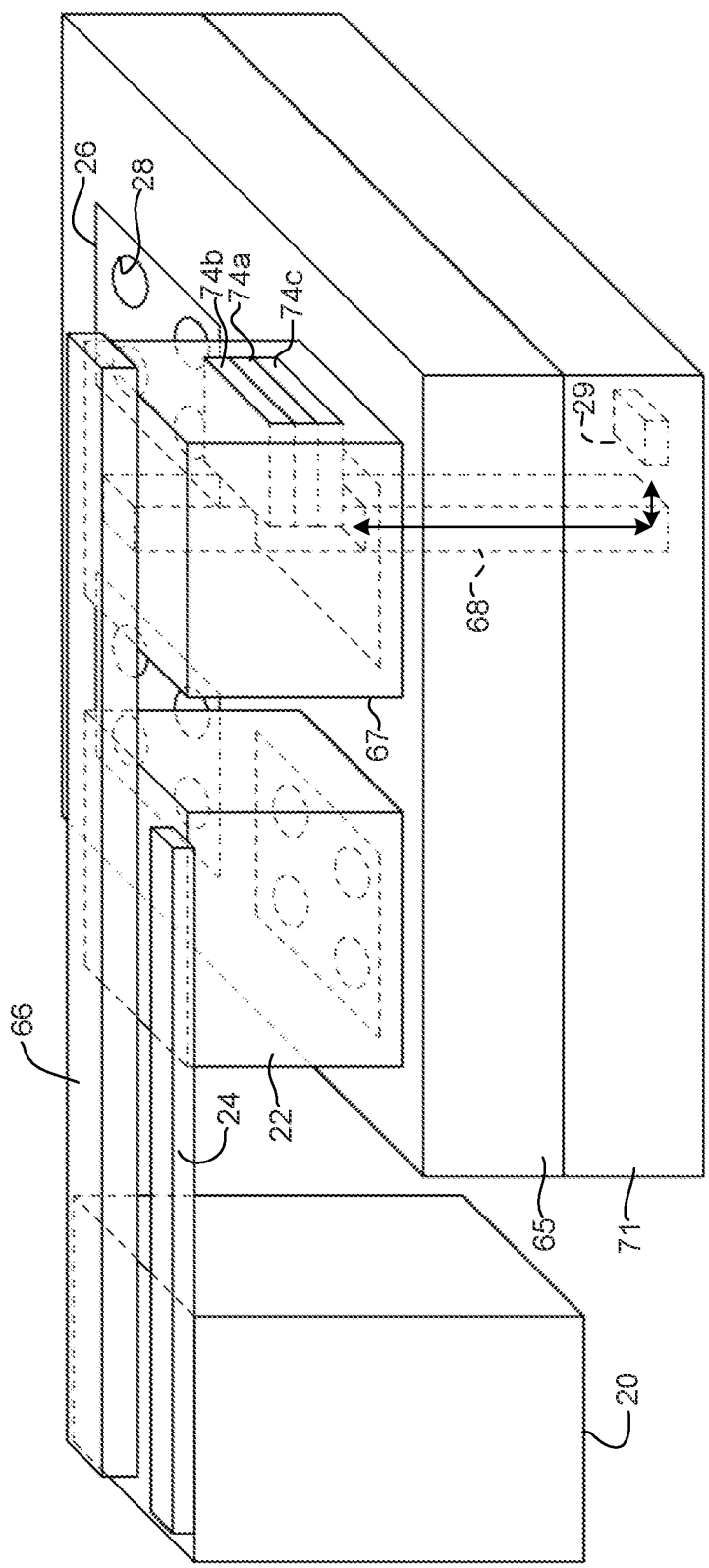
FIG. 6 is a schematic perspective illustrating a connector optically coupled to the optical path and electrically coupled to the POL module, in accordance with one embodiment.

In one or more embodiments, optical signals and pulse power may be received from a connector inserted into a connector cage coupled to the optical path as shown in FIG. 6. As previously described with respect to FIG. 2, the fixed POL module 20 is coupled to the regulated POL module 22 via the power bridge 24. A high power (ESP, pulse power) bridge 66 connects the fixed POL 20 to a connector (connector cage) 67 positioned on a first (upper) side of cold plate 65. Optical signals and are received at optical interface 74a and power (e.g., multi-phase pulse power) is received at electrical interfaces 74b, 74c). One or more optical signals are transmitted to or from the photonic chip 29 via optical path 68 passing through the cold plate 65 and substrate 71, as previously described with respect to FIG. 2. The optical path 68 optically couples the optical interface 74a and photonic chip 29. The multi-phase pulse power is transmitted from the electrical interfaces 74b, 74c to the fixed POL 20 via the high-power bridge 66 and is used to power the regulated POL via the power bridge 24. In one example, the multi-phase pulse power may be transmitted from the electrical interfaces 74b, 74c to the high-power bridge 66 via an electrical path integrally formed with the optical path 68 or by other means through the connector (connector and connector cage) 67. As previously described with respect to FIG. 1, the multi-phase pulse power may be modified before being transmitted from the fixed POL module 20 to the regulated POL module 22.

As noted above, the cold plate 65 may be the "lower cold plate", with the optical and electrical paths extending upward through the cold plate to the substrate and die package. The optical and electrical paths may also be located in both cold plates for power and optical signal distribution from both sides of the substrate and die package.

Figure 7:
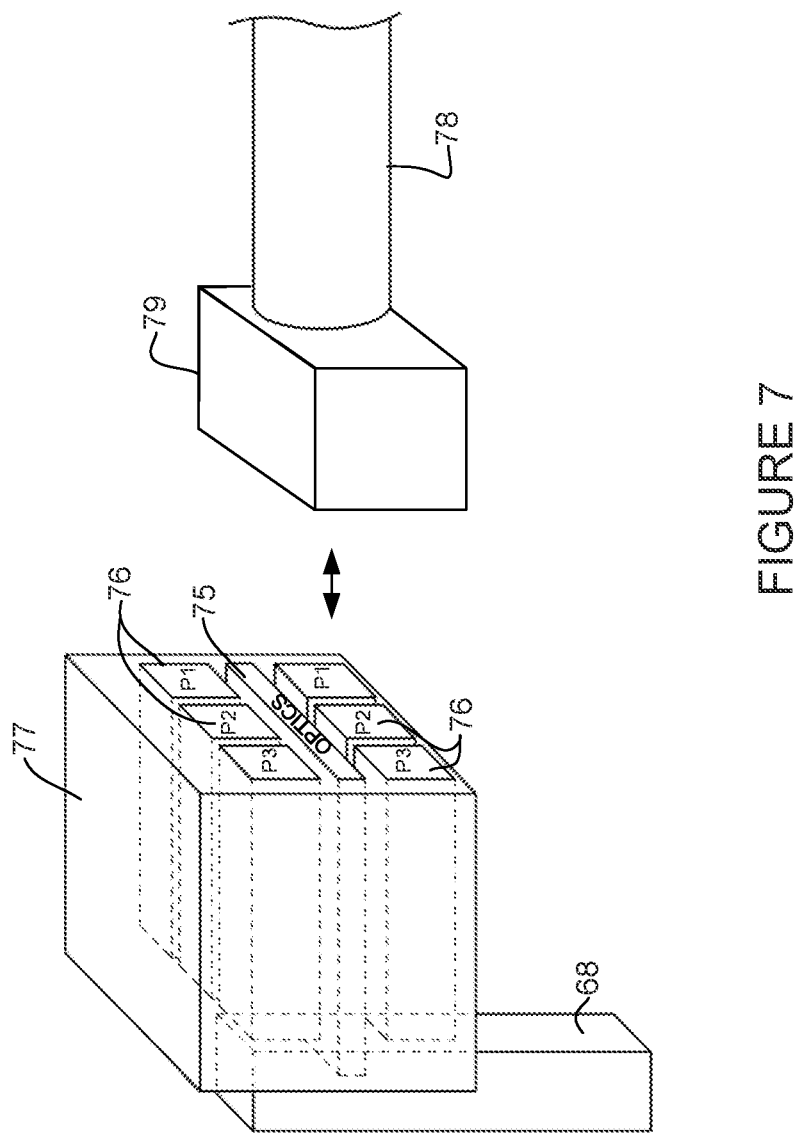
FIG. 7 is a perspective schematically illustrating details of the connector shown in FIG. 6 aligned with a cable and connector assembly, in accordance with one embodiment.

FIG. 7 illustrates details of the optical and electrical connector, in accordance with one embodiment. As previously described, a connector 77 is coupled to the optical path 68. The connector 77 includes an optical interface 75 and electrical interfaces 76. In one or more embodiments, the optical interface 75 may be configured for mating with an MPO (Multi-fiber Push On) type connector 79, as described below with respect to FIGS. 8A and 8B. In one example, optical interface 75 comprises a photonic element (e.g., photonic die). In the example shown in FIG. 7, the electrical interfaces 76 are configured for receiving three-phase pulse power (P1, P2, P3). A hybrid cable 78 comprising one or more optical fibers and electrical wires (e.g., two optical fibers and three-pair copper) is coupled to cable connector 79 for mating with the connector 77 mounted on the cold plate.

It is to be understood that the interface configuration shown in FIG. 7 is only an example and that the connector 77 may be configured for coupling with any number of optical fibers or electrical wires (wire pairs) for receiving any number of phases of pulse power and receiving or transmitting any number of optical signals.

In one or more embodiments, the optical portion of the connector assembly may be configured as shown and described in U.S. patent application Ser. No. 16/544,699 ("Connection Features for Electronic and Optical Packaging"), filed Aug. 19, 2019, which is incorporated herein by reference in its entirety. The connector may be modified to include electrical power input (e.g., multi-phase pulse power as described above with respect to FIG. 7).

Figure 8A:
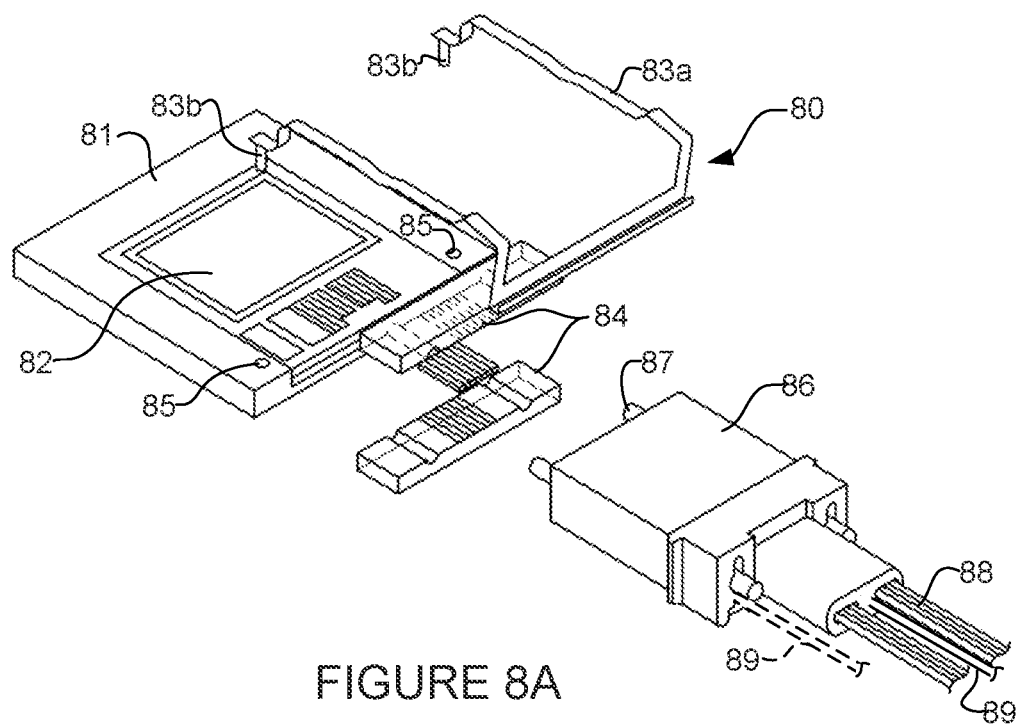
FIG. 8A is an exploded perspective of an optical and electrical connector and cable and connector assembly, in accordance with one embodiment.
Figure 8B:
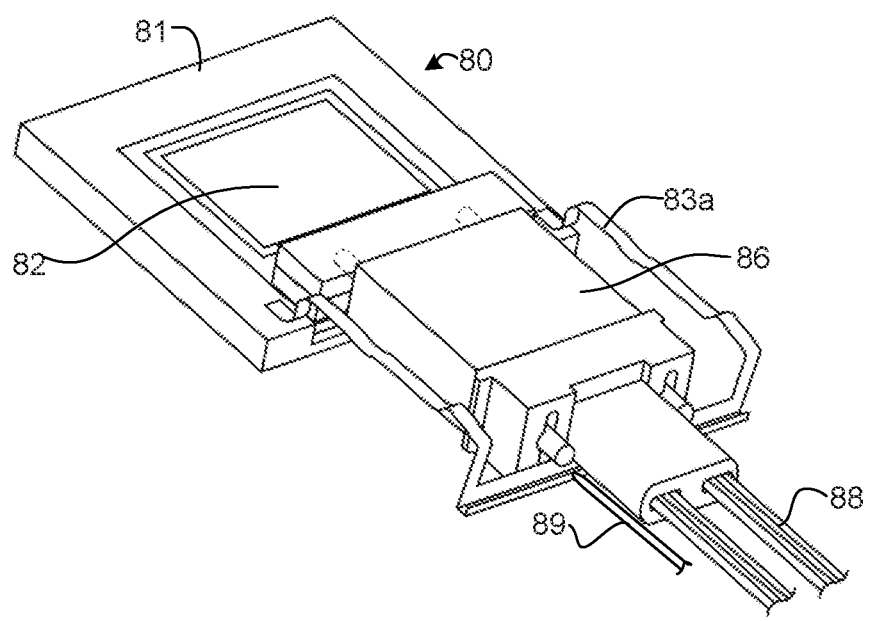
FIG. 8B is a perspective of the cable and connector assembly coupled to the optical and electrical connector of FIG. 8A.

FIGS. 8A and 8B illustrate an example of a clamp assembly configured for use with an MPO connector. It is to be understood that MPO is only one example and the clamp assembly may be used with other types of optical connectors (e.g., LC connector). As described below, a clamp structure of the connector assembly may be used to provide an electrical contact between the optical and electrical cable and a photonics package. The optical signals are transmitted through the optical fiber, while the clamp provides contact for electrical signals. The clamp and electrical connection may be integrated into a photonics die by using the clamp to provide an electrical contact.

FIG. 8A illustrates an exploded view of a connector assembly, in accordance with one embodiment. The connector assembly includes an optical and electrical connector, generally indicated at 80, that is mounted on the cold plate, as previously described with respect to FIG. 6, and a cable connector 86, which is used to couple the hybrid cable to the package. The optical and electrical connector 80 comprises a frame 81, a photonic element (e.g., photonic integrated circuit) 82 mounted in the frame, an optical adapter 84, and a fastener (clamp) 83a. The photonic element 82 optically interfaces with the optical adapter 84 to carry optical signals to the photonic element 82 from the cable connector 86 via optical fibers. The photonic element 82 may include one or more waveguides connected to an optical component integrated within the photonic element. The frame 81 includes openings 85 for receiving attachment fingers 83b (pegs) of the fastener 83a. The openings 85 provide a mechanical connection point for the fastener 83a including the mechanical attachment portion 83b. As previously noted, the fastener (clamp) 83a may provide an electrical connection between the cable connector 86 coupled to one or more wire pairs 89 and the optical and electrical connector 80.

The cable connector 86 provides an optical connection between optical fibers 88 and the optical features on the photonic element 82 and an electrical connection between electrical wires 89 in the cable and an electrical interface on the connector 80. The cable connector 86 may include alignment pins 87, which may assist in the mechanical alignment of the optical connector to the frame 81 and photonic element 82. As previously noted, the cable connector 86 may comprise an MPO connector modified to provide an electrical connection between electrical wires 89 in the hybrid cable and the connector 80. Electrical wires 89, which are received in a hybrid cable comprising the optical fibers 88 and electrical wires, may be coupled to the cable connector at various locations. For example, as shown in FIG. 8A, the electrical wires 89 may enter the cable connector 86 along with the optical fibers 88 or may be received on one or more edge portions of the cable connector.

The assembled optical and electrical connector 80 and cable connector 86 are shown in FIG. 8B. In this example, the electrical wires 89 are shown offset from the optical fibers 88 with an electrical connection formed between the electrical wires and the fastener 83a. As previously noted, an MPO connector may be modified to receive the electrical wires or the electrical wires may be coupled independently to the connector 80 (e.g., electrically coupled to the clamp assembly).

It is to be understood that the connector assembly shown in FIGS. 8A and 8B is only an example and other types of optical and electrical connectors may be used, without departing from the scope of the embodiments.

Figure 9:
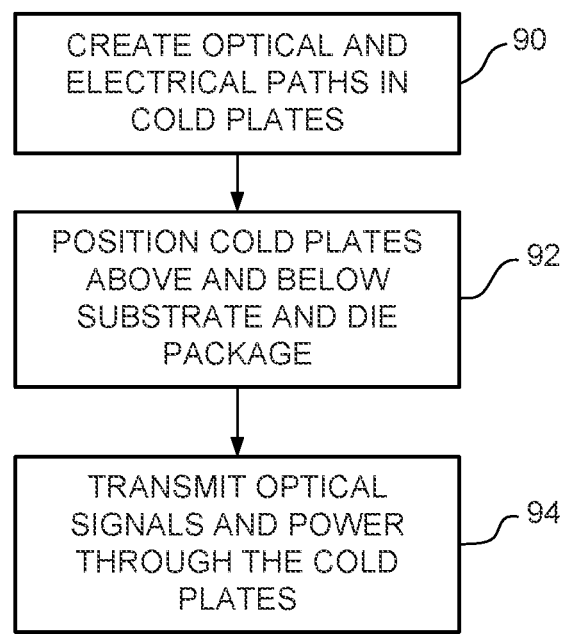
FIG. 9 is a flowchart illustrating an overview of a process for distributing power and electronics through multiple cold plates, in accordance with one embodiment.

FIG. 9 is a flowchart illustrating an overview of a process for implementing the power and optical signal distribution system through multiple cold plates, in accordance with one embodiment. At step 90, optical and electrical paths are created through the cold plates. As previously described, the paths extend from one surface (e.g., upper surface) to an opposite surface (e.g., lower surface) of the cold plate to electronically couple a power connector to an electronic integrated circuit (die, chip, ASIC, SerDes) or optically couple an optical connector to a photonic integrated circuit (die, optical engine, photonic chip). Creating the electrical path may include inserting a power delivery block comprising the electrical path into the cold plate. Creating the optical path may include inserting a waveguide for transmitting light through the cold plate. As previously described, one or more optical path structures (e.g., periscope optical assembly) may be inserted into openings formed in the cold plate and attached to one or more other optical structures to form the optical path between the photonic die and the optical connector positioned on an outer side of the cold plate (FIGS. 4C and 4D).

The cold plates are positioned on opposite sides of the substrate and die package (step 92). Optical signals and power are then transmitted through the cold plates from one or more electrical or optical connectors to one or more electronic or photonic integrated circuits (step 94).

It is to be understood that the process shown in FIG. 9 and described above is only an example and steps may be added, modified, combined, or reordered without departing from the scope of the embodiments.

Figure 10:
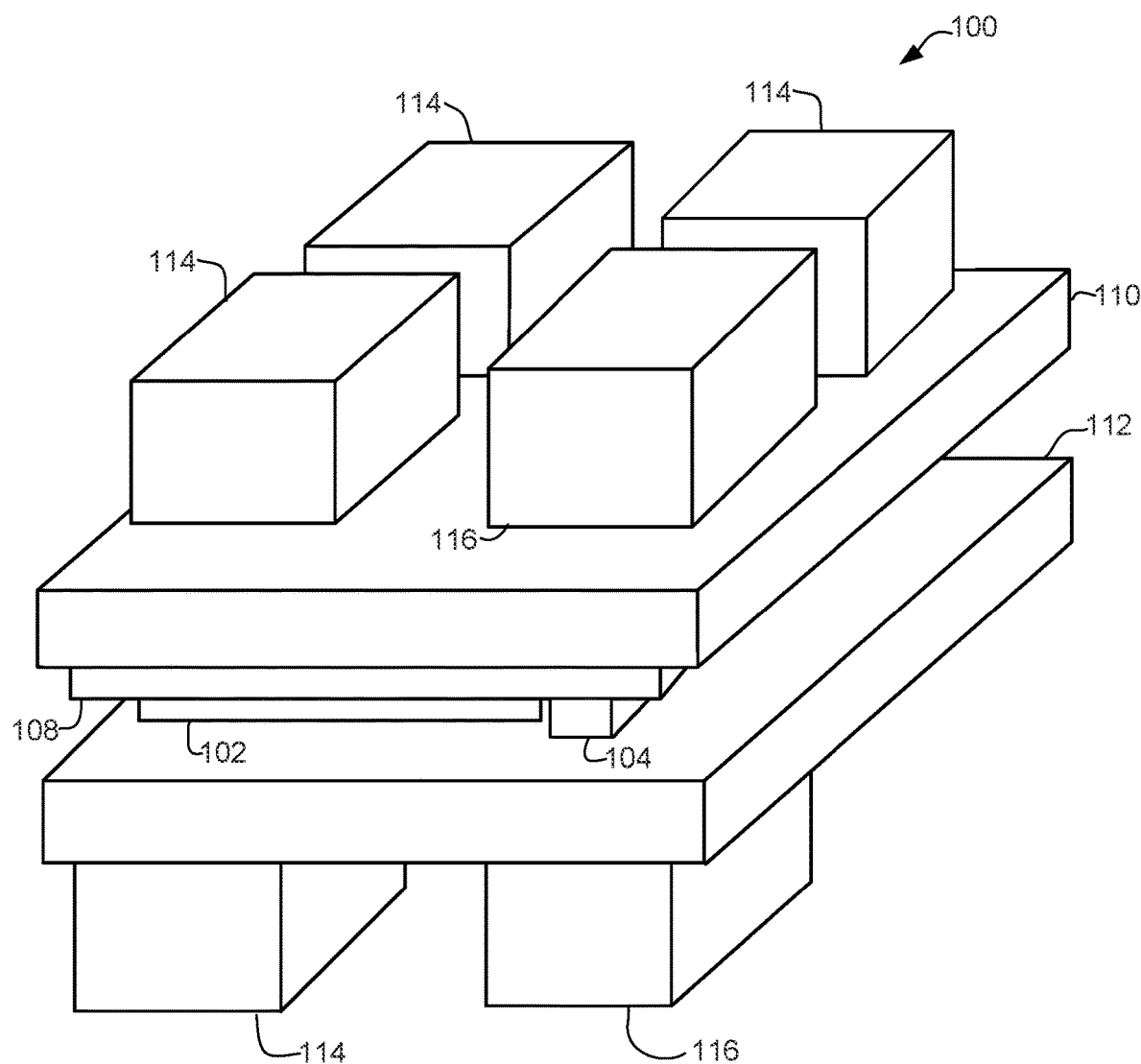
FIG. 10 is a schematic perspective of the substrate and die package interposed between the cold plates with POL modules and optical connectors mounted on the cold plates, in accordance with one embodiment.

FIG. 10 is a perspective of an assembly (apparatus), generally indicated at 100, comprising a substrate and die package (electrical die 102, optical engine 104, and SerDes (not shown in FIG. 10) coupled to substrate 108) interposed between cold plates 110, 112. Electrical connectors (POL modules) 114 and optical connectors 116 are mounted on an outer surface of the cold plates 110, 112. As described in detail above, each cold plate comprises a plurality of electrical paths and optical paths (shown in FIGS. 11 and 12).

In one or more embodiments, the apparatus 100 comprises the upper cold plate 110 and the lower cold plate 112, at least one of the upper cold plate or the lower cold plate comprising an electrical or optical path extending therethrough, a substrate and die package (substrate 108, die 102, optical engine 104) interposed between the upper cold plate and the lower cold plate, and a connector 114, 116 coupled to one of the upper cold plate or the lower cold plate for transmitting power or an optical signal through the electrical or optical path to the substrate and die package.

In one or more embodiments, the apparatus 100 comprises a first cold plate (110 or 112) comprising the electrical path extending therethrough and a second cold plate comprising the optical path 122 extending therethrough, the substrate and die package comprising at least one electronic integrated circuit (die 102) and at least one photonic integrated circuit (optical engine 104), the substrate and die package interposed between the two cold plates, an electrical connector (POL module) 114 coupled to the first cold plate for transmitting power or electrical signals through the electrical path, and an optical connector 116 coupled to the second cold plate for transmitting optical signals through the optical path.

Figure 11:
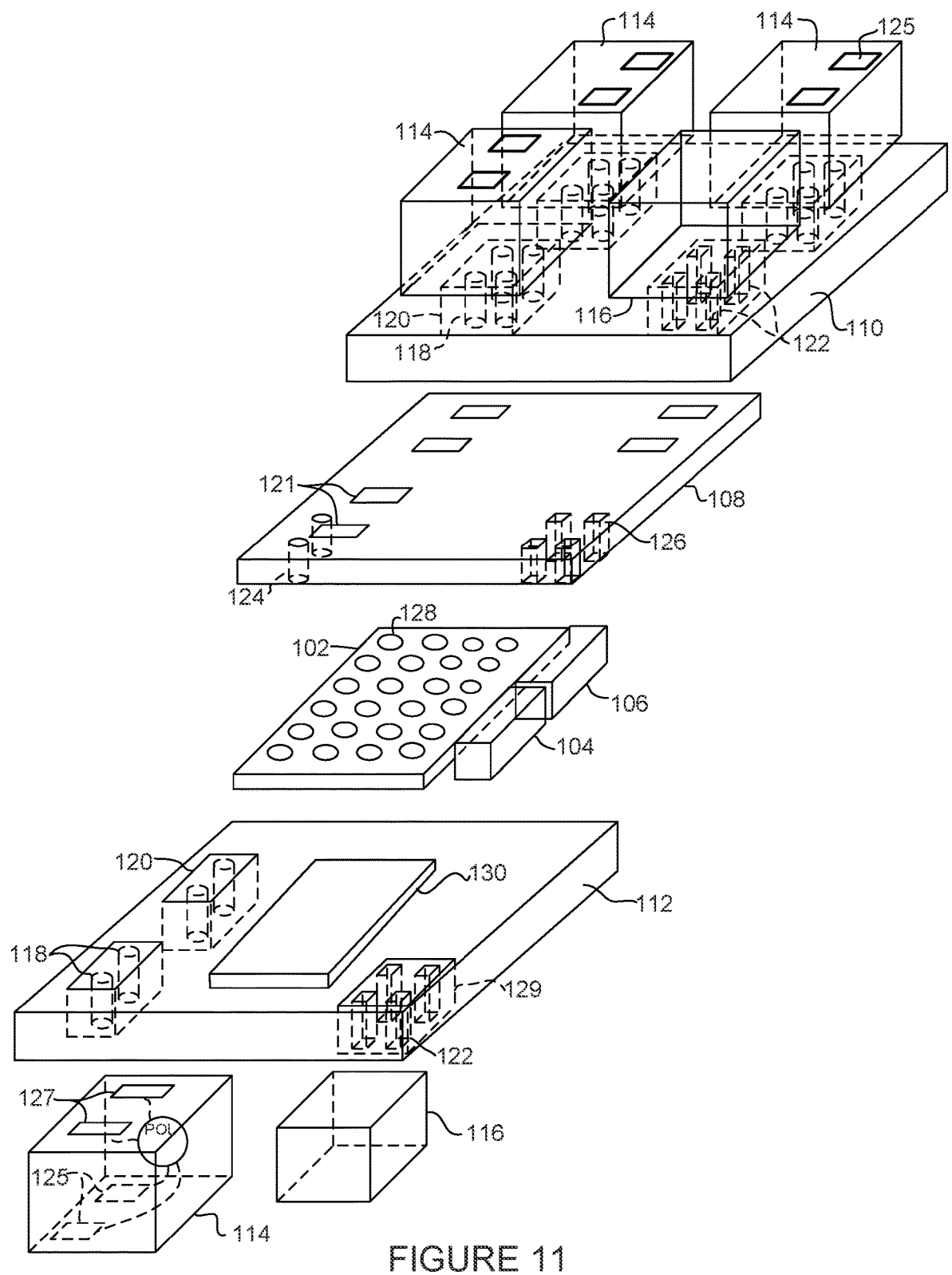
FIG. 11 is a partially exploded view of the assembly shown in FIG. 10 showing details of the substrate and die package and lower cold plate.

FIG. 11 is a partially exploded view illustrating details of components positioned below the upper cold plate 110. The substrate 108 comprises a plurality of power/ground attach pads 121. Power/ground posts 124 are shown for attachment to a lower cold plate pass thru. Optical paths (wave guides) 126 extend through the substrate 108 for passing optical signals through the substrate, as previously described. Silicon die bumps 128 are shown on an upper surface of the die 102. In this example, the substrate and die package includes the optical engine 104 and SerDes chip 106. The optical engine 104 is positioned to receive or transmit optical signals from or to the optical connector 116 mounted on an outer surface of the cold plates 110, 112 (upper surface of upper cold plate 110, lower surface of lower cold plate 112). Each cold plate 110, 112 comprises electrical paths 118 in power blocks 120 and optical paths 122 in optical block 129. As previously noted, the electrical paths 118 may transmit power or electrical signals (e.g., communications) therethrough. A thermal pad 130 is positioned on an inner surface of the lower cold plate 112 for thermal contact with the die 102, as previously described.

In the example shown in FIG. 11, the electrical connector 114 comprises two IBV (Intermediate Bus Voltage) or FMP (Fault Managed Power) power connections 125 electrically coupled to pads 127 for output power and ground for direct attach to the cold plate. It is to be understood that this is only an example, and the electrical connector may comprise any number of power and ground connection points.

Figure 12:
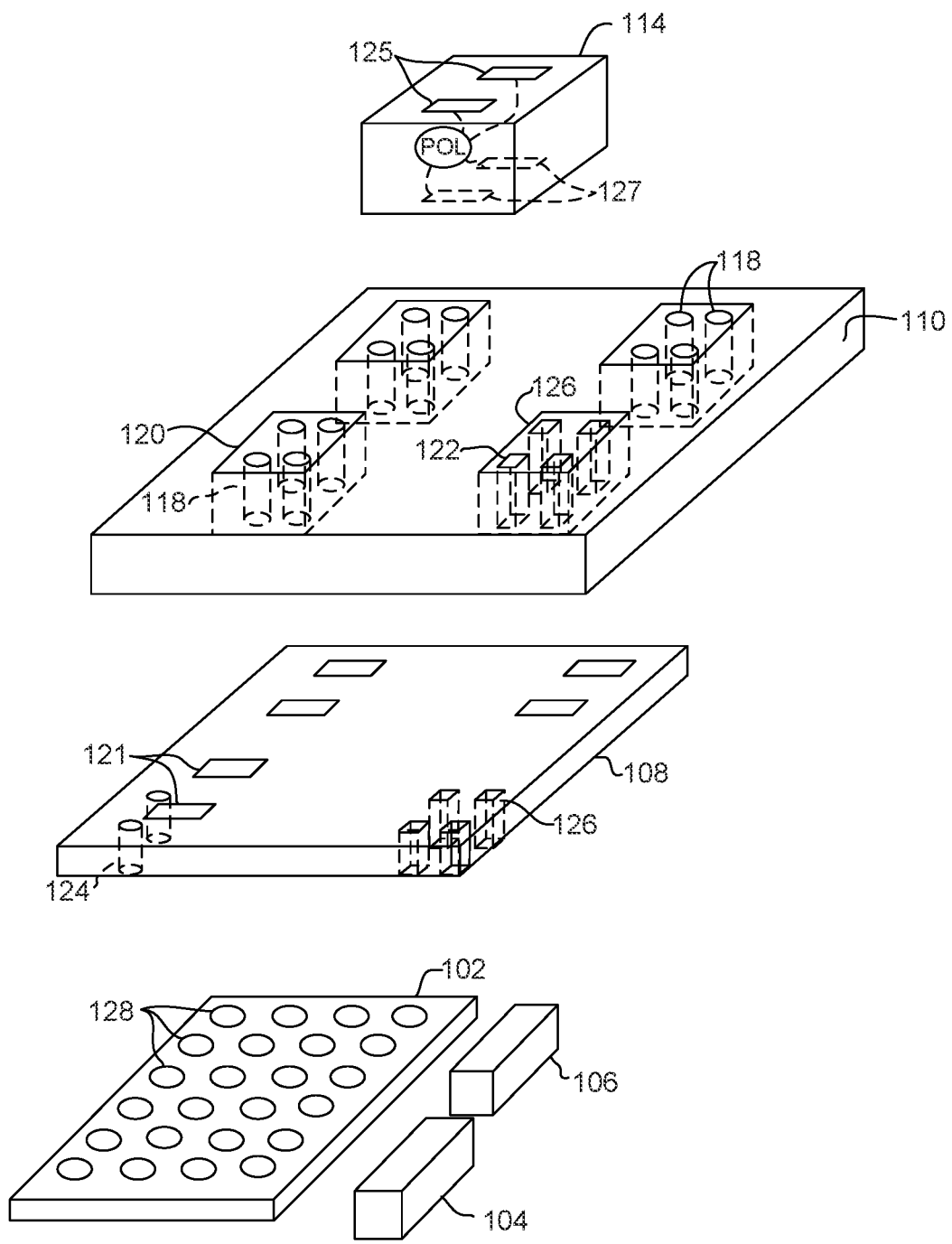
FIG. 12 is an exploded view of a portion of the assembly shown in FIG. 10 showing details of the substrate and die package and upper cold plate.

FIG. 12 is an exploded view of one of the POL modules 114, upper cold plate 110, substrate 108, die 102, optical engine 104, and SerDes chip 106. The electrical connector 114 comprises power connection points 125, 127 as described above with respect to FIG. 11.

In the example shown in FIGS. 10-12, each cold plate 110, 112 comprises a plurality of electrical and optical paths for coupling with the electrical connectors 114 and optical connectors 116. In another example, only one of the cold plates may comprise an optical or electrical path. In yet another example, one of the cold plates may comprise only electrical paths and the other cold plate may comprise only optical paths. The cold plate may include any number of optical paths for transmitting optical signals and electrical paths for transmitting power or electrical signals (e.g., communications). Any number of electrical or optical connectors may be coupled (e.g., mounted on) one or both cold plates for electrical or optical connection with the electrical or optical paths. Also, although two individual cold plates are shown and described herein, the two cold plates may be physically connected (e.g., rotatable or moveable connection) or thermally coupled to one another.

Figure 13:
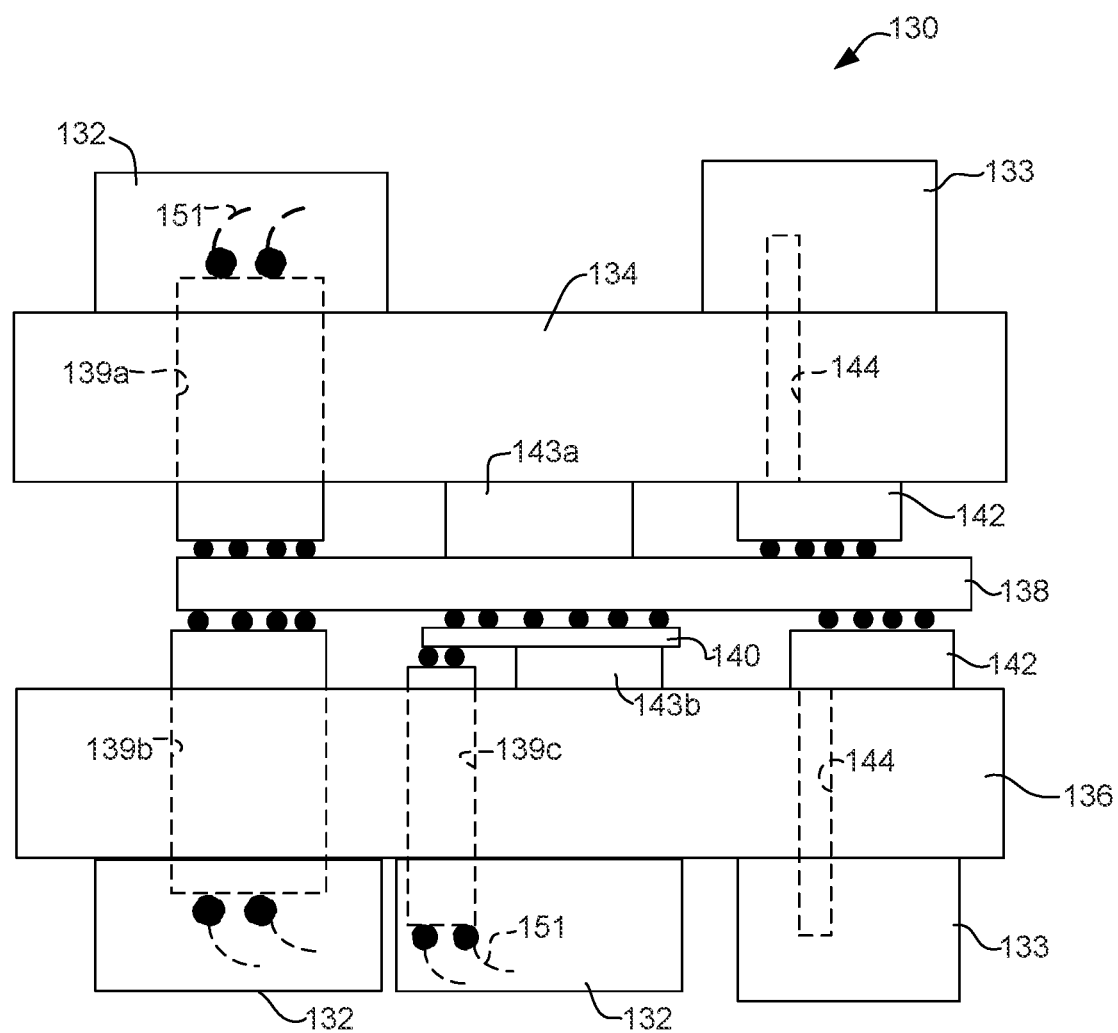
FIG. 13 is a side view of the substrate and die package and cold plates, in accordance with one embodiment.

FIG. 13 is a side view of an assembly 130 comprising a substrate and die package (substrate 138, die (NPU, ASIC, electronic integrated circuit) 140, optical engines 142, and SerDes 149 (shown in FIG. 14)) interposed between cold plates 134, 136, in accordance with one embodiment. In this example, POL modules 132 and optical connectors 133 are mounted on an outer surface of the upper cold plate 134 and lower cold plate 136. Electrical paths (power blocks) 139*a* and 139*b* extend through the cold plates 134 and 136, respectively, for transmitting power from the POL modules 132 to the substrate 138. Individual electrical paths within the power block are not shown, for simplification. Electrical path 139*c* transmits power directly from one of the POL modules 132 to the electronic integrated circuit (die, chip) 140. In this example, optical engines 142 are mounted on both sides of the substrate 138 and coupled directly to the optical connectors 133 through optical paths 144. Thermal pad 143*a* thermally couples the upper cold plate 134 to the substrate 138. Thermal pad 143*b* thermally couples the lower cold plate 136 and die 140. In this example, the power blocks containing the electrical paths extend beyond an inner surface of the cold plate 134, 136 for contact with the substrate 138 or die 140.

Figure 14:
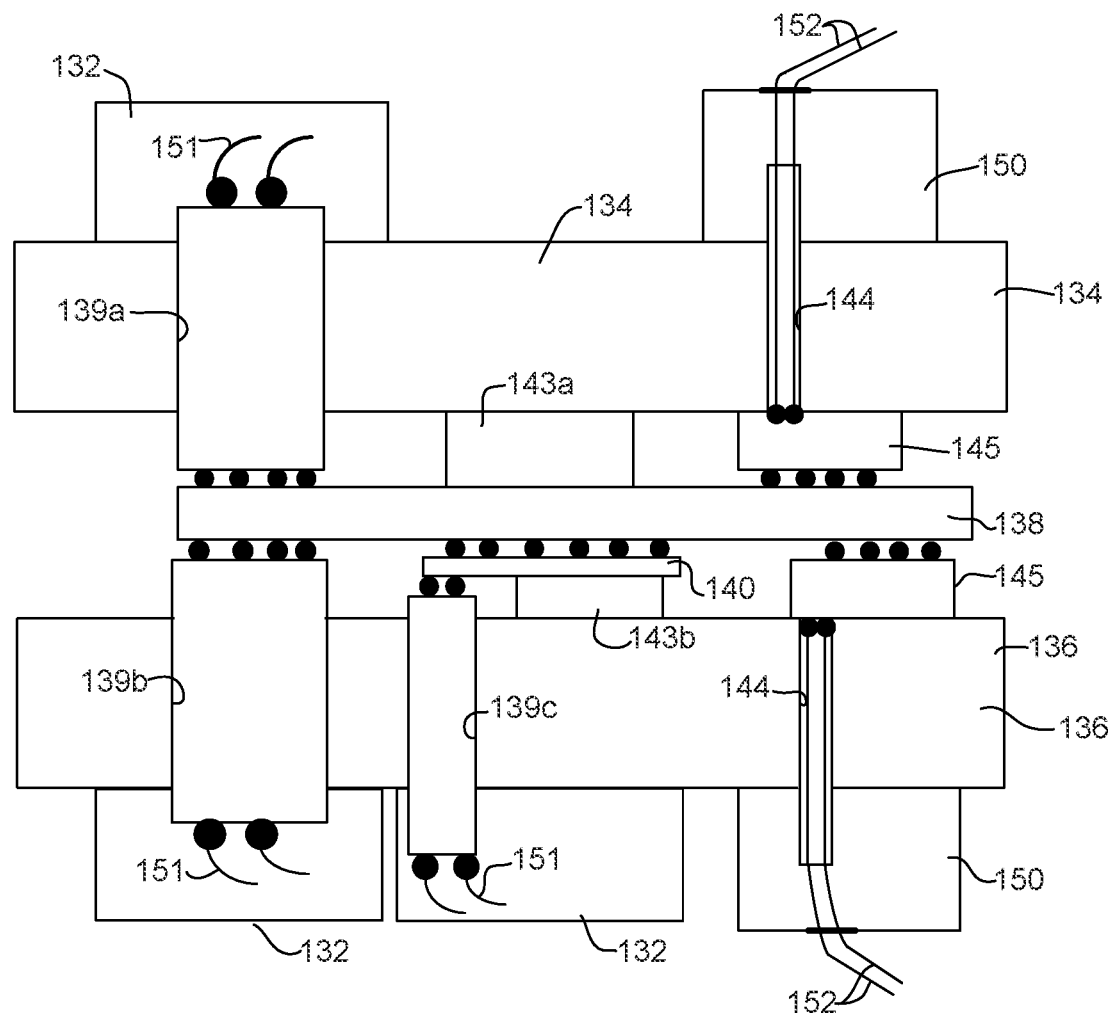
FIG. 14 is a cross-sectional view of the assembly shown in FIG. 13.

FIG. 14 is a cross-sectional view showing the electrical chips (e.g., SerDes) 145 positioned behind the optical engines 142 shown in FIG. 13. In this example, electrical connectors 150 provide power through electrical wires 152 to the SerDes chip 145. The electrical wire 152 passes through a power via, as previously described.

It is to be understood that the components and arrangement shown in FIGS. 13 and 14 is only an example and changes may be made without departing from the scope of the embodiments. For example, the substrate and die package may include any number of electrical or optical components in any arrangement. Also, any number of POL modules, optical connectors, electrical connectors, or optical/electrical connectors may be used for transferring power, optical signals, or power and optical signals through the cold plates.

Although the apparatus and method have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
   an upper cold plate and a lower cold plate, each of the upper cold plate and the lower cold plate comprising at least one of an electrical path or an optical path extending therethrough;
   a substrate and die package interposed between the upper cold plate and the lower cold plate; and
   a power block,
   wherein an optical signal is delivered to or from the substrate and die package via the optical path extending through a first cold plate of the upper cold plate and the lower cold plate, and power is supplied to the substrate and die package via the electrical path extending through a second cold plate of the upper cold plate and the lower cold plate, and
   wherein the power block is configured to be inserted into the second cold plate and includes the electrical path that extends beyond an inner surface of the second cold plate to contact the substrate and die package.

2. The apparatus of claim 1, wherein the electrical path includes a power via formed in the power block.

3. The apparatus of claim 1, wherein the substrate and die package includes an optical engine and wherein the optical path includes a waveguide for transmitting light through the first cold plate and to or from the optical engine.

4. The apparatus of claim 1, wherein each of the upper cold plate and the lower cold plate include the optical path and the electrical path.

5. The apparatus of claim 1, wherein at least one of the upper cold plate and the lower cold plate includes both the optical path and the electrical path formed separately from one another.

6. The apparatus of claim 1, wherein at least one of the electrical path or the optical path includes at least one first path extending through the upper cold plate and at least one second path extending through the lower cold plate.

7. The apparatus of claim 1, wherein the substrate and die package comprises at least one electronic integrated circuit and at least one photonic integrated circuit.

8. An apparatus comprising:
   a first cold plate comprising an optical path extending therethrough;
   a second cold plate comprising an electrical path extending therethrough;
   a power block; and
   a substrate and die package comprising at least one electronic integrated circuit and at least one photonic integrated circuit, the substrate and die package interposed between the first cold plate and the second cold plate,
   wherein an optical signal is delivered to or from the substrate and die package via the optical path extending through the first cold plate and power is supplied to the substrate and die package via the electrical path extending through the second cold plate from a power delivery block inserted into the second cold plate, and
   wherein the power block is configured to be inserted into the second cold plate and includes the electrical path that extends beyond an inner surface of the second cold plate to contact the substrate and die package.

9. The apparatus of claim 8, wherein the electrical path includes a power via formed in the power block.

10. The apparatus of claim 8, wherein the substrate and die package includes an optical engine and wherein the optical path includes a waveguide for transmitting light through the first cold plate and to or from the optical engine.

11. The apparatus of claim 8, wherein each of the first cold plate and the second cold plate include the optical path and the electrical path.

12. The apparatus of claim 8, wherein at least one of the first cold plate and the second cold plate includes both the optical path and the electrical path formed separately from one another.

13. The apparatus of claim 8, wherein each of the first cold plate and the second cold plate includes a plurality of electrical paths and a plurality of optical paths.

14. A method comprising:
   creating an electrical path and an optical path through a first cold plate and a second cold plate;
   positioning the first cold plate and the second cold plate on opposite sides of a substrate and die package;
   transmitting power through the electrical path to the substrate and die package; and
   transmitting an optical signal through the optical path to and from the substrate and die package.

15. The method of claim 14, wherein creating the electrical path comprises inserting a power delivery block into one of the first cold plate and the second cold plate.

16. The method of claim 15, wherein the electrical path includes a power via formed in the power delivery block.

17. The method of claim 14, wherein creating the optical path includes inserting a waveguide for transmitting light through one of the first cold plate and the second cold plate.

18. The method of claim 14, wherein creating the electrical path and the optical path includes:
   creating the electrical path and the optical path through each of the first cold plate and the second cold plate.

19. The method of claim 14, further comprising:
   transmitting communications through the electrical path to the substrate and die package.

20. The method of claim 14, wherein creating the optical path includes inserting one or more optical path structures into an opening in one of the first cold plate and the second cold plate.

* * * * *